(12) United States Patent
Jang et al.

(10) Patent No.: US 12,707,855 B2
(45) Date of Patent: Aug. 11, 2026

(54) DISPLAY DEVICE AND MANUFACTURING METHOD OF THE SAME

(71) Applicant: SAMSUNG DISPLAY CO., LTD., Yongin-si (KR)

(72) Inventors: Hokyung Jang, Yongin-si (KR); Koichi Sugitani, Yongin-si (KR); Gwui-Hyun Park, Yongin-si (KR); Saehee Han, Yongin-si (KR)

(73) Assignee: SAMSUNG DISPLAY CO., LTD., Yongin-si (KR)

( * ) Notice: Subject to any disclaimer, the term of this patent is extended or adjusted under 35 U.S.C. 154(b) by 0 days.

(21) Appl. No.: 18/944,535

(22) Filed: Nov. 12, 2024

(65) Prior Publication Data

US 2025/0275412 A1 Aug. 28, 2025

(30) Foreign Application Priority Data

Feb. 26, 2024 (KR) ........................ 10-2024-0027450

(51) Int. Cl.

| | |
|---|---|
| ***H10K 59/40*** | (2023.01) |
| ***G06F 3/041*** | (2006.01) |
| ***G06F 3/044*** | (2006.01) |
| ***H10K 59/12*** | (2023.01) |
| ***H10K 59/126*** | (2023.01) |
| ***H10K 102/00*** | (2023.01) |

(52) U.S. Cl.

CPC ........... *H10K 59/40* (2023.02); *G06F 3/0412* (2013.01); *G06F 3/0443* (2019.05); *H10K 59/1201* (2023.02); *H10K 59/126* (2023.02); *H10K 2102/351* (2023.02)

(58) Field of Classification Search

None

See application file for complete search history.

(56) References Cited

U.S. PATENT DOCUMENTS

| | | | | |
|---|---|---|---|---|
| 11,422,654 | B2 | 8/2022 | Choi et al. | |
| 2012/0249465 | A1* | 10/2012 | Lin | H05K 1/0306 345/173 |
| 2014/0091225 | A1* | 4/2014 | Sasaki | G01T 1/2006 250/366 |
| 2015/0293630 | A1* | 10/2015 | Ishizaki | G06F 3/0446 345/174 |
| 2016/0268314 | A1* | 9/2016 | Kong | H10D 86/441 |
| 2019/0123112 | A1* | 4/2019 | Lee | H10K 59/40 |
| 2019/0204966 | A1* | 7/2019 | Zhou | G06F 3/0443 |
| 2021/0095137 | A1* | 4/2021 | Lim | C09D 5/1662 |

FOREIGN PATENT DOCUMENTS

| | | |
|---|---|---|
| KR | 10-2022-0021055 A | 2/2022 |

* cited by examiner

*Primary Examiner* — Christopher R Lamb

(74) *Attorney, Agent, or Firm* — F. CHAU & ASSOCIATES, LLC

(57) ABSTRACT

A display device includes a display panel including a plurality of emission areas. An input sensor is on the display panel. The input sensor includes a first sensor insulation layer on the display panel. A first sensor conductive layer is disposed on the first sensor insulation layer. The first sensor conductive layer includes a plurality of first conductive patterns. An organic pattern directly contacts side surfaces of each of the plurality of first conductive patterns. The organic pattern includes an organic binder. The organic pattern includes concave slope surfaces having a decreasing gradient from a top of the organic pattern to a bottom of the organic pattern in a thickness direction of the display device.

20 Claims, 14 Drawing Sheets

FIG. 3

100
PL2
PL1
EDV
PX
SL-C2
100-DA
100-NDA
ELm
SLm
SL1
EL1
PD1
DIC
SDV
SL-C1
DR1
DR2
DR3

200
200-DA:100-DA
200-NDA:100-NDA
E1-1
E1-2
E1-3
E1-4
E1
E2-1
E2-2
E2-3
E2-4
E2-5
E2-6
E2-7
E2
SP1
SP2
CP1
CP2
SL1
SL2
II
II'
DR1
DR2
DR3

261
262
260

DISPLAY DEVICE AND MANUFACTURING METHOD OF THE SAME

CROSS-REFERENCE TO RELATED APPLICATIONS

This application claims priority under 35 U.S.C. § 119 to Korean Patent Application No. 10-2024-0027450, filed on Feb. 26, 2024 in the Korean Intellectual Property Office, the disclosure of which is incorporated by reference in its entirety herein.

1. TECHNICAL FIELD

The present disclosure herein relates to a display device and a manufacturing method of the same.

2. DISCUSSION OF RELATED ART

Various multimedia devices include a display device for displaying an image to a user through a display screen. Examples of such multimedia devices include a television, a tablet, a navigation device, a gaming device, or the like. The display device may include a display panel for generating an image and an input sensor for sensing touches from the user.

The input sensor may include a conductor for sensing an external input. However, the conductor of the input sensor disposed on the display panel may influence the light extraction efficiency or an external light reflection ratio.

SUMMARY

The present disclosure provides a display device having increased optical characteristics and a manufacturing method thereof.

According to an embodiment of the present inventive concept, a display device includes a display panel including a plurality of emission areas. An input sensor is on the display panel. The input sensor includes a first sensor insulation layer on the display panel. A first sensor conductive layer is disposed on the first sensor insulation layer. The first sensor conductive layer includes a plurality of first conductive patterns. An organic pattern directly contacts side surfaces of each of the plurality of first conductive patterns. The organic pattern includes an organic binder. The organic pattern includes concave slope surfaces having a decreasing gradient from a top of the organic pattern to a bottom of the organic pattern in a thickness direction of the display device.

In an embodiment, the organic binder may include at least one compound selected from polyimide, polyamide, polybenzimidazole, polybenzothiazole, polybenzoxazole, polybenzobisxazole, and polyamide-imide.

In an embodiment, the organic pattern may be optically transparent in a visible ray wavelength region.

In an embodiment, the display device may further include an optical layer disposed on the input sensor. The optical layer includes a color filter overlapping each of the plurality of emission areas in a plan view.

In an embodiment, the optical layer may further include a light-blocking pattern overlapping each of the plurality of first conductive patterns in the plan view.

In an embodiment, a taper angle of the side surfaces of each of the plurality of first conductive patterns may be in a range of about 60 degrees to about 80 degrees.

In an embodiment, a taper angle at intermediate points on the concave slope surfaces of the organic pattern may be in a range of about 40 degrees to about 60 degrees.

In an embodiment, each of the plurality of first conductive patterns may include a first side surface and a second side surface facing the first side surface. The organic pattern may include a first organic pattern directly contacting the first side surface, and a second organic pattern directly contacting the second side surface.

In an embodiment, each of the plurality of first conductive patterns may include a first lower conductive layer on the first sensor insulation layer. A second lower conductive layer is disposed on the first lower conductive layer. The second lower conductive layer includes a material that is different from a material of the first lower conductive layer.

In an embodiment, the input sensor may further include a second sensor insulation layer on the first sensor conductive layer. A second sensor conductive layer is disposed on the second sensor insulation layer. The second sensor conductive layer includes a plurality of second conductive patterns.

In an embodiment, the thickness of each of the plurality of first conductive patterns is in a range of about 500 nm to about 1200 nm.

In an embodiment, the input sensor may further include an additional organic pattern directly contacting side surfaces of each of the plurality of second conductive patterns. The additional organic pattern includes the organic binder.

In an embodiment, the display panel may include a pixel definition layer having emission openings defined therein that respectively overlap the plurality of emission areas in a plan view. Light-emitting elements including a light-emitting layer are disposed at least within the emission openings.

In an embodiment, the display panel may further include an encapsulation layer on the light-emitting element and the pixel definition layer. The input sensor is disposed directly on the encapsulation layer.

In an embodiment, the input sensor may further includes a first detection electrode including a plurality of first detection patterns arranged along a first direction and a plurality of bridge patterns connecting adjacent two first detection patterns of the plurality of first detection patterns to each other. A second detection electrode is spaced apart from the first detection electrode. The second detection electrode includes a plurality of second detection patterns extending along a second direction crossing the first direction. Portions of the plurality of first detection patterns, the plurality of second detection patterns, and the plurality of bridge patterns include the plurality of first conductive patterns.

According to an embodiment of the present inventive concept, a display device includes a display panel including a plurality of emission areas. An input sensor is on the display panel. The input sensor includes a first sensor insulation layer on the display panel. A first sensor conductive layer is disposed on the first sensor insulation layer. The first sensor conductive layer includes a plurality of first conductive patterns. An organic pattern directly contacts side surfaces of each of the plurality of first conductive patterns. The organic pattern includes an organic binder. The organic binder includes at least one compound selected from polyimide, polyamide, polybenzimidazole, polybenzothiazole, polybenzoxazole, polybenzobisxazole, and polyamide-imide.

In an embodiment, the organic binder may include polyimide and a fluorinated material selected from polybenzimidazole, polybenzothiazole, polybenzoxazole, polybenzobisxazole, and polyamide-imide.

According to an embodiment of the present inventive concept, a display device manufacturing method includes providing a display panel including a plurality of emission areas. An input sensor is provided on the display panel. The providing of a display panel includes providing a first sensor insulation layer on the display panel. A first sensor conductive layer is provided on the first sensor insulation layer. The first sensor conductive layer includes a plurality of first conductive patterns. An organic composition is supplied to directly contact side surfaces of each of the plurality of first conductive patterns to provide an organic pattern. The organic pattern includes concave slope surfaces having a decreasing gradient from a top of the organic pattern to a bottom of the organic pattern in a thickness direction of the display panel.

In an embodiment, the organic composition may include solid powder and a solvent having the solid powder dispersed therein. A solid content in the organic composition is less than or equal to about 5 wt %.

In an embodiment, the organic composition may initially form a preliminary organic pattern on the side surfaces of each of the plurality of first conductive patterns. The preliminary organic pattern is cured to provide the organic pattern. The organic pattern may include at least one compound selected from polyimide, polyamide, polybenzimidazole, polybenzothiazole, polybenzoxazole, polybenzobisxazole, and polyamide-imide.

BRIEF DESCRIPTION OF THE DRAWINGS

The accompanying drawings are included to provide a further understanding of non-limiting embodiments of the present inventive concept, and are incorporated in and constitute a part of this specification. The drawings illustrate non-limiting embodiments of the present inventive concept and, together with the description, serve to explain principles of the present inventive concept. In the drawings:

FIG. 3 is a plane view of a display panel according to an embodiment of the present inventive concept;

DETAILED DESCRIPTION OF EMBODIMENTS

Figure 1:
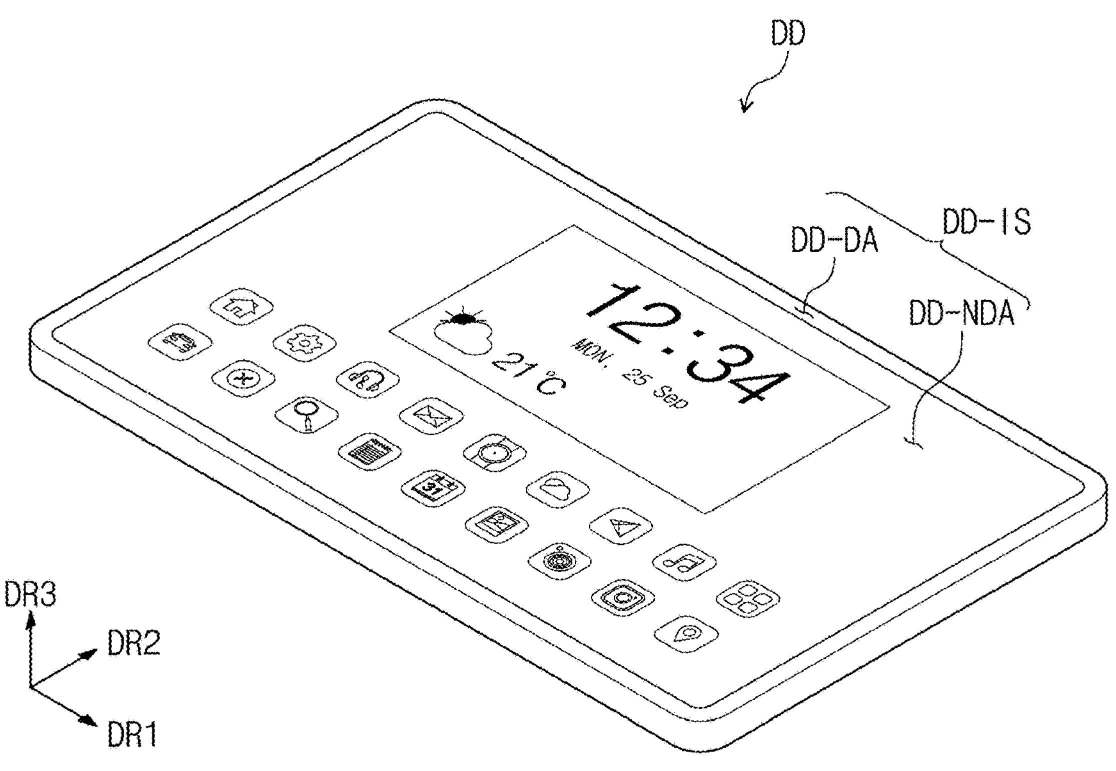
FIG. 1 is a perspective view of a display device according to an embodiment of the present inventive concept.

It will be understood that when an element or layer is referred to as being "on", "connected to" or "coupled to" another element or layer, it can be directly on, connected or coupled to the other element or intervening third elements may be present.

On the other hand, "being directly disposed" or "being disposed directly" may mean that there is not an additional layer, film, region, plate or other intervening third element between a part of a layer, film, region, plate or the like and another part. For example, "being directly disposed" or "being disposed directly" may mean that disposition of two layers or two members is performed without using an additional member such as an adhesive member therebetween.

Like reference numerals in the drawings refer to like elements. In addition, in the drawings, the thickness and the ratio and the dimension of the element may be exaggerated for effective description of the technical contents. The term "and/or" includes all combinations of one or more of which associated configurations may define.

Terms such as first, second, and the like may be used to describe various elements, but these elements should not be limited by the terms. Such terms are only used for distinguishing one element from other elements. For instance, a first component may be referred to as a second component, or similarly, a second component may be referred to as a first component, without departing from the scope of embodiments of the present disclosure. The singular expressions include plural expressions unless the context clearly dictates otherwise.

In addition, terms such as "below," "lower," "above," "upper," and the like are used to describe the relationship of the configurations shown in the drawings. The terms are used as a relative concept and are described with reference to the direction indicated in the drawings.

It should be understood that the terms "comprise" or "have" are intended to specify the presence of stated features, integers, steps, operations, elements, components, or combinations thereof in the disclosure, but do not preclude the presence or addition of one or more other features, integers, steps, operations, elements, components, or combinations thereof.

Unless otherwise defined, all terms (including technical and scientific terms) used herein have the same meaning as commonly understood by one of ordinary skill in the art to which example embodiments belong. In addition, it will be further understood that terms, such as those defined in commonly-used dictionaries, should be interpreted as having a meaning that is consistent with their meaning in the context of the relevant art and will not be interpreted in an idealized or overly formal sense unless expressly so defined herein.

Hereinafter, embodiments of the present inventive concept will be described with reference to the accompanying drawings.

FIG. 1 is a perspective view of a display device DD according to an embodiment of the present inventive concept. As shown in FIG. 1, the display device DD may display an image via a display surface DD-IS. In an embodiment, the display panel DP may have a rectangular shape having relatively long sides extending in a first direction DR1 and relatively short sides extending in a second direction DR2 crossing the first direction DR1 in a plan view. However, embodiments of the present inventive concept are not necessarily limited thereto, and a display module DM may have various shapes such as circular or polygonal shapes in a plan view. Additionally, while the first and second directions DR1, DR2 are shown as being perpendicular to each other, embodiments of the present inventive concept are not necessarily limited thereto and the first and second directions DR1, DR2 may cross each other at various different angles.

In an embodiment, a third direction DR3 may be defined as a direction substantially perpendicular to a plane defined by the first direction DR1 and the second direction DR2. The front surface (e.g., a top surface) and the rear surface (e.g., a bottom surface) of each member constituting the display device DD may be opposing to each other in the third direction DR3, and each normal direction of the front surface and rear surface may be substantially parallel to the third direction DR3. The separation distance between the front and rear surfaces defined along the third direction DR3 may correspond to the thickness of the member.

In the present specification, the expression “in a plan view” may mean a state of being viewed in the third direction DR3. Namely, “in a plan view” may be described on the basis of a plane defined by the first direction DR1 and the second direction DR2. In the present specification, the expression “in a cross-sectional view” may mean a state of being viewed in the first direction DR1 or the second direction DR2. On the other hand, directions indicated by the first to third directions DR1, DR2, and DR3 are relative concepts, and may be changed to other directions.

In an embodiment of the present inventive concept, the display device DD is illustrated as including a planar display surface. However, embodiments of the present inventive concept are not necessarily limited thereto. For example, in an embodiment the display device DD may include a curved display surface or a stereoscopic display surface. The stereoscopic display surface may include a plurality of display areas indicating different directions, for example, a bended display surface. The display device DD according to an embodiment may be a flexible display device DD. The flexible display device DD may be a foldable display device that may be folded, rolled or otherwise deformed.

In an embodiment, an example display device DD applicable to a tablet terminal is shown. In an embodiment, the tablet terminal may be constituted by arranging electronic modules mounted on a main board, a camera module, a power supply module or the like in a bracket/case together with the display device DD. The display device DD according to an embodiment of the present inventive concept may be applied to a large electronic device such as a television, a monitor or the like, or a small or medium electronic device such as a tablet, a vehicle navigator, a gaming machine, a smart watch, or the like. However, embodiments of the present inventive concept are not necessarily limited thereto.

As illustrated in FIG. 1, the display surface DD-IS includes an image area DD-DA on which an image IM is displayed, and a bezel area DD-NDA adjacent to the display area DD-DA (e.g., in the first and second directions DR1, DR2). The bezel area DD-NDA is an area on which the image is not displayed. FIG. 1 shows software application icons and a clock, temperature and calendar window as example images. However embodiments of the present inventive concepts are not necessarily limited thereto and the image may be various different subject matter.

As shown in FIG. 1, the image area DD-DA may have a substantially rectangle shape. The “substantially rectangle shape” includes not only a geometric rectangle shape, but also a rectangle shape with curved boundaries instead of vertices defined in vertex areas (e.g., corner areas).

The bezel area DD-NDA may surround the image area DD-DA (e.g., in the first and second directions DR1, DR2). However, embodiments of the present inventive concept are not necessarily limited thereto, and the shape of the bezel area DD-NDA may be changed. For example, the bezel area DD-NDA may be disposed only on one side of the image area DD-DA in some embodiments.

Figure 2:
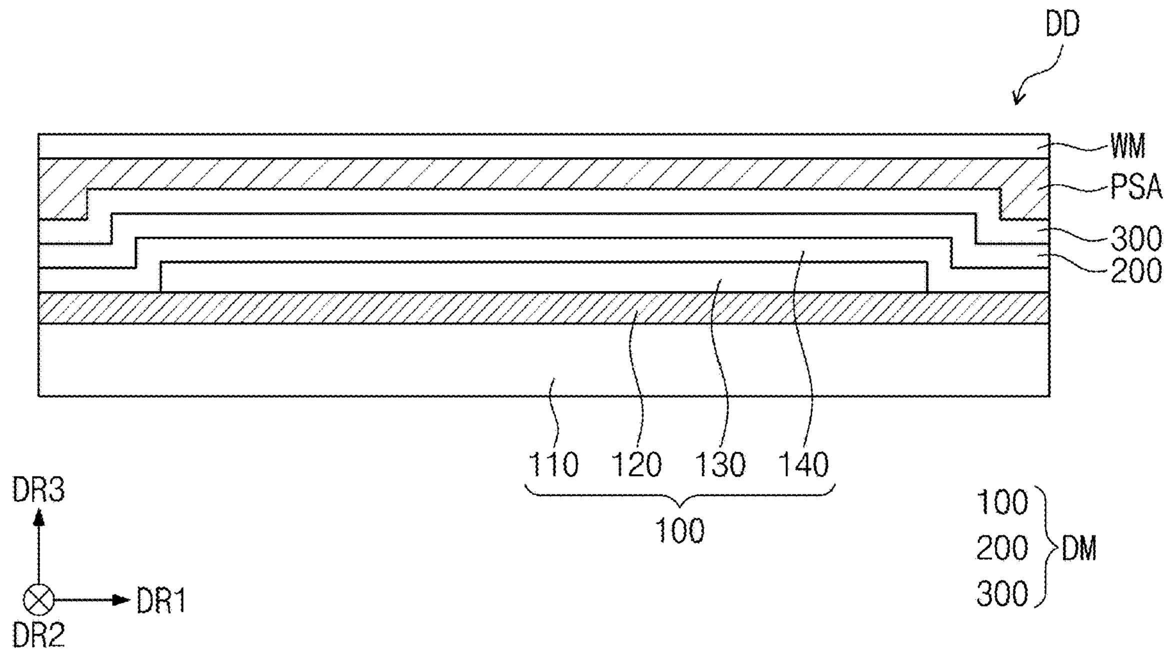
FIG. 2 is a cross-sectional view of a display device according to an embodiment of the present inventive concept.

FIG. 2 is a cross-sectional view of the display device DD according to an embodiment of the present inventive concept.

The display device DD may include a display module DM and a window WM disposed on the display module WM. In an embodiment, the display module DM and the window WM may be adhered to each other with an adhesive layer PSA. However, embodiments of the present inventive concept are not necessarily limited thereto. For example, in an embodiment the window WM may be provided in a coating manner, and the window WM may directly contact the display module DM with the adhesive layer PSA omitted.

In an embodiment, the display module DM may include a display panel 100, an input sensor 200, and an optical layer 300. In an embodiment, the display panel 100 may include a base layer 110, a driving element layer 120, a light-emitting element layer 130, and an encapsulation layer 140.

The driving element layer 120 may be disposed on the top surface of the base layer 110 (e.g., disposed directly thereon in the third direction DR3). In an embodiment, the base layer 110 may be a flexible substrate that is bendable, foldable, rollable, or the like. In an embodiment, the base layer 110 may be a glass substrate, a metal substrate, a polymer substrate, or the like. However, embodiments of the present inventive concept are not necessarily limited thereto, and the base layer 110 may be an inorganic layer, an organic layer, or a composite material layer. In an embodiment, the base layer 110 may have a substantially same shape as the display panel 100.

The base layer 110 may have a multi-layer structure. For example, in an embodiment the base layer 110 may include a first synthetic resin layer, a second synthetic resin layer, and inorganic layers disposed therebetween. In an embodiment, each of the first and second synthetic resin layers may include a polyimide-based resin. However, embodiments of the present inventive concept are not necessarily limited thereto.

The driving element layer 120 may be disposed on the base layer 110 (e.g., disposed directly thereon in the third direction DR3). The driving element layer 120 may include a plurality of insulation layers, a plurality of semiconductor patterns, a plurality of conductive patterns, a plurality of signal lines or the like. The driving element layer 120 may include a pixel driving circuit.

The light-emitting element layer 130 may be disposed on the driving element layer 120 (e.g., disposed directly thereon in the third direction DR3). The light-emitting element layer 130 may include a light-emitting element. For example, in an embodiment the light-emitting element may include an organic light-emitting material, an inorganic light-emitting material, an organic-inorganic light-emitting material, quantum dots, quantum rods, micro-LEDs, or nano-LEDs.

The encapsulation layer 140 may be disposed on the light-emitting element layer 130 (e.g., disposed directly thereon). The encapsulation layer 140 may protect the light-emitting element layer 130, such as the light-emitting elements, from a foreign matter such as moisture, oxygen and dust particles. The encapsulation layer 140 may include at least one encapsulation inorganic layer. For example, in an embodiment the encapsulation layer 140 may include a laminate structure of a first inorganic encapsulation layer/an organic encapsulation layer/a second inorganic encapsulation layer.

In an embodiment, the input sensor 200 may be disposed directly on the display panel 100 (e.g., in the third direction DR3). The input sensor 200 may detect a user input in, for example, an electromagnetic induction manner and/or an electrostatic capacitive manner. The display panel 100 and the input sensor 200 may be provided through continuous processes. Here, to be "disposed directly" may mean that a third component is not disposed between the input sensor 200 and the display panel 100. For example, a separate adhesive layer may not be disposed between the input sensor 200 and the display panel 100 (e.g., in the third direction DR3).

The optical layer 300 reduces reflectance of external light incident from the upper side of the window WM. The optical layer 300 according to an embodiment of the present inventive concept may include a phase retarder and a polarizer. The retarder may have a film type or a liquid crystal coating type, and include a λ/2 retarder and/or a λ4 retarder. The polarizer may also have a film type or a liquid crystal coating type. The film type may include a stretched synthetic resin film, and the liquid crystal coating type may include liquid crystals arranged in a prescribed array. The phase retarder and the polarizer may further include protection films. The phase retarder and polarizer themselves or the protection films may be defined as the base layer of the optical layer 300.

The optical layer 300 according to an embodiment of the present inventive concept may include color filters. Each of the color filters may overlap an emission area of the plurality of emission areas described herein in a plan view. The color filters may have a prescribed array. For example, the array of the color filters may be determined in consideration of emission colors of pixels included in the display panel 100. The optical layer 300 may further include a black matrix adjacent to the color filters. The optical layer 300 including the color filters may be disposed directly on the display panel 100.

The window WM according to an embodiment of the present inventive concept may include a base layer and a light-blocking pattern. The base layer may include a glass substrate and/or a synthetic resin film, etc. The light-blocking pattern partially overlaps the base layer WP-BS (e.g., in a plan view). The light-blocking pattern may be disposed on the rear surface of the base layer, and substantially defines the bezel area DD-NDA (see FIG. 1) of the display device DD. An area in which the light-blocking pattern is not disposed may define the image area DD-DA of the display device DD.

Figure 3:
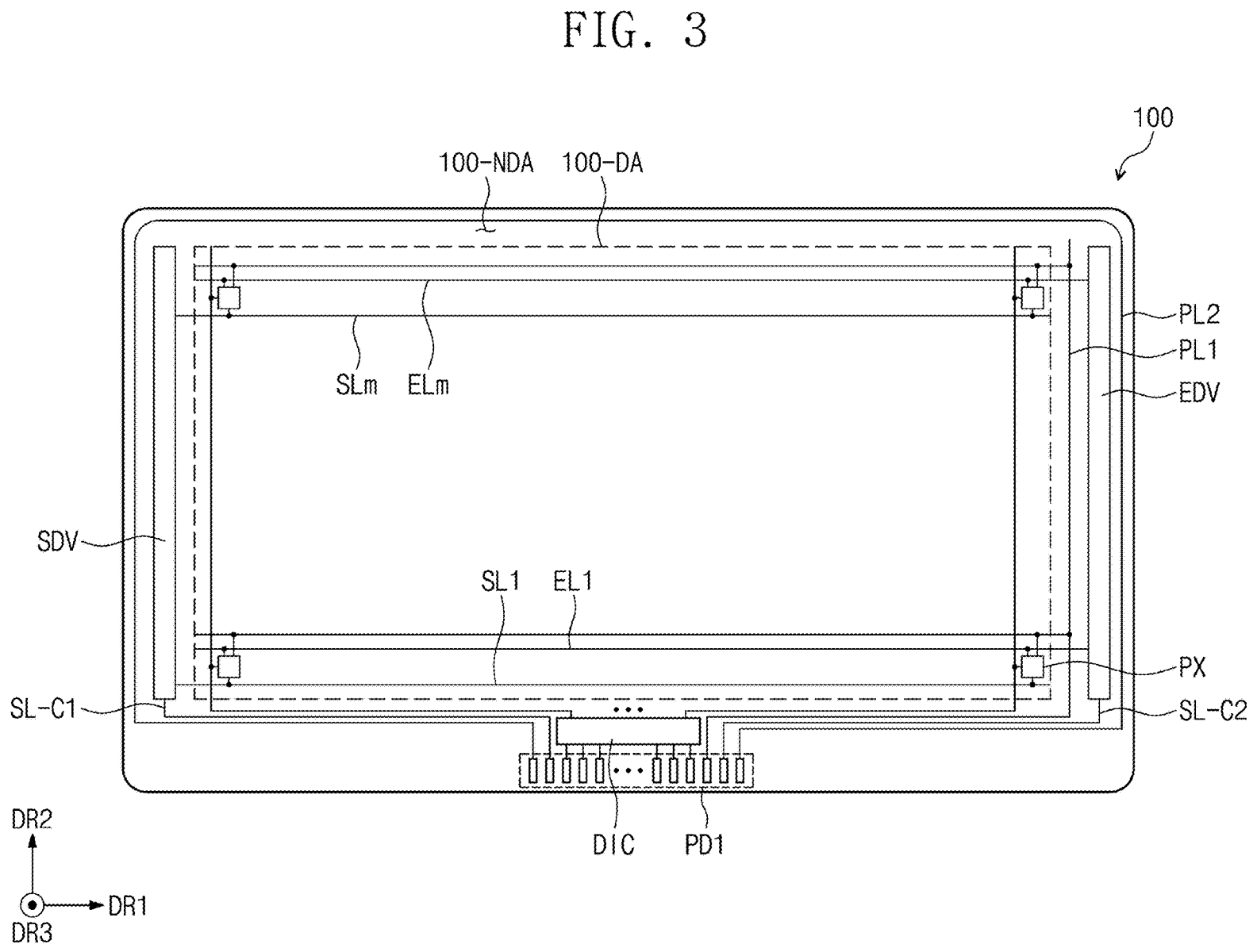

FIG. 3 is a plan view of the display panel DD according to an embodiment of the present inventive concept.

Referring to FIG. 3, in an embodiment the display panel 100 may include a plurality of pixels PX, a scan driving circuit SDV, an emission driving circuit EDV, a plurality of signal lines, and a plurality of pads PD. The plurality of pixels PX are disposed in the display area 100-DA. A driving chip DIC mounted on the non-display area 100-NDA may include a data driving circuit. The display area 100-DA may correspond to the image area DD-DA of FIG. 1, and the non-display area 100-NDA may correspond to the bezel area DD-NDA. "An area or a portion corresponds to an area or a portion" described herein means at least partially overlapping (e.g., in the third direction DR3), and two different areas or portions are not necessarily limited to have the same area. The data driving circuit in an embodiment is also integrated into the display panel 100 like the scan driving circuit SDV and the emission driving circuit EDV.

The plurality of scan lines may include a plurality of scan lies SL1 to SLm, a plurality of data lines DL1 to DLn, a plurality of emission lines EL1 to ELm, first and second control lines SL-C1 and CS12, and first and second power lines PL1 and PL2. Here, m and n each are a natural number of 2 or greater.

The scan lines SL1 to SLm may extend in the first direction DR1 to be electrically connected to the pixels PX and the scan driving circuit SDV. The data lines DL1 to DLn may extend in the second direction DR2 to be electrically connected to the pixels PX and the driving chip DIC. The emission lines EL1 to ELm may extend in the first direction DR1 to be electrically connected to the pixels PX and the emission driving circuit EDV.

In an embodiment, the first power line PL1 may receive a first power supply voltage, and the second power line PL2 may receive a second power supply voltage having a lower level than the first power supply voltage. In an embodiment, a second electrode (e.g., a cathode) of the light-emitting element is connected to the second power line PL2.

The first control line SL-C1 may be connected to the scan driving circuit SDV and extend towards a lower end of the display panel 100. The second control line SL-C2 may be connected to the emission driving circuit EDV, and extends to the lower end of the display panel 100. The pads PD may be disposed in the non-display area 100-NDA adjacent to the lower end of the display panel 100, and be positioned more adjacent to the lower end of the display panel 100 than to the driving chip DIC. The pads PD may be connected to the driving chip DIC and a portion of the signal lines.

The scan driving circuit SDV may generate a plurality of scan signals, and the scan signals may be applied to the pixels PX through the scan lines SL1 to SLm. The driving chip DIC may generate a plurality of data voltages, and the data voltages may be applied to the pixels PX through the data lines DL1 to DLn. The emission driving circuit EDV may generate a plurality of emission signals, and the emission signals may be applied to the pixels PX through the emission lines EL1 to ELm. The pixels PX may receive the data voltages in response to the scan signals. The pixels PX may display an image by emitting light of the brightness corresponding to the data voltages in response to the emission signals.

Figure 4A:
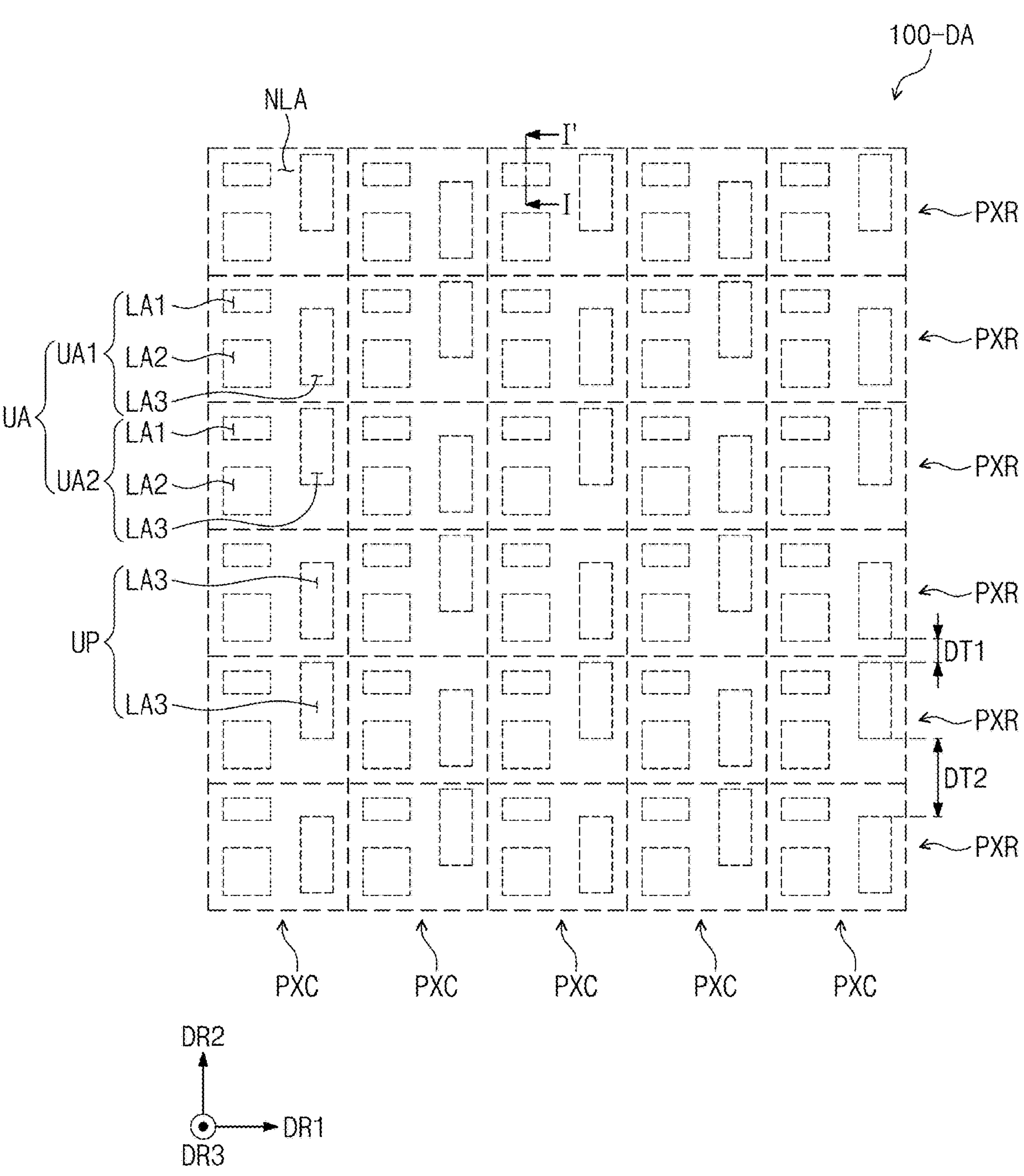
FIGS. 4A to 4C are enlarged cross-sectional views of a display area according to embodiments of the present inventive concept.
Figure 4B:
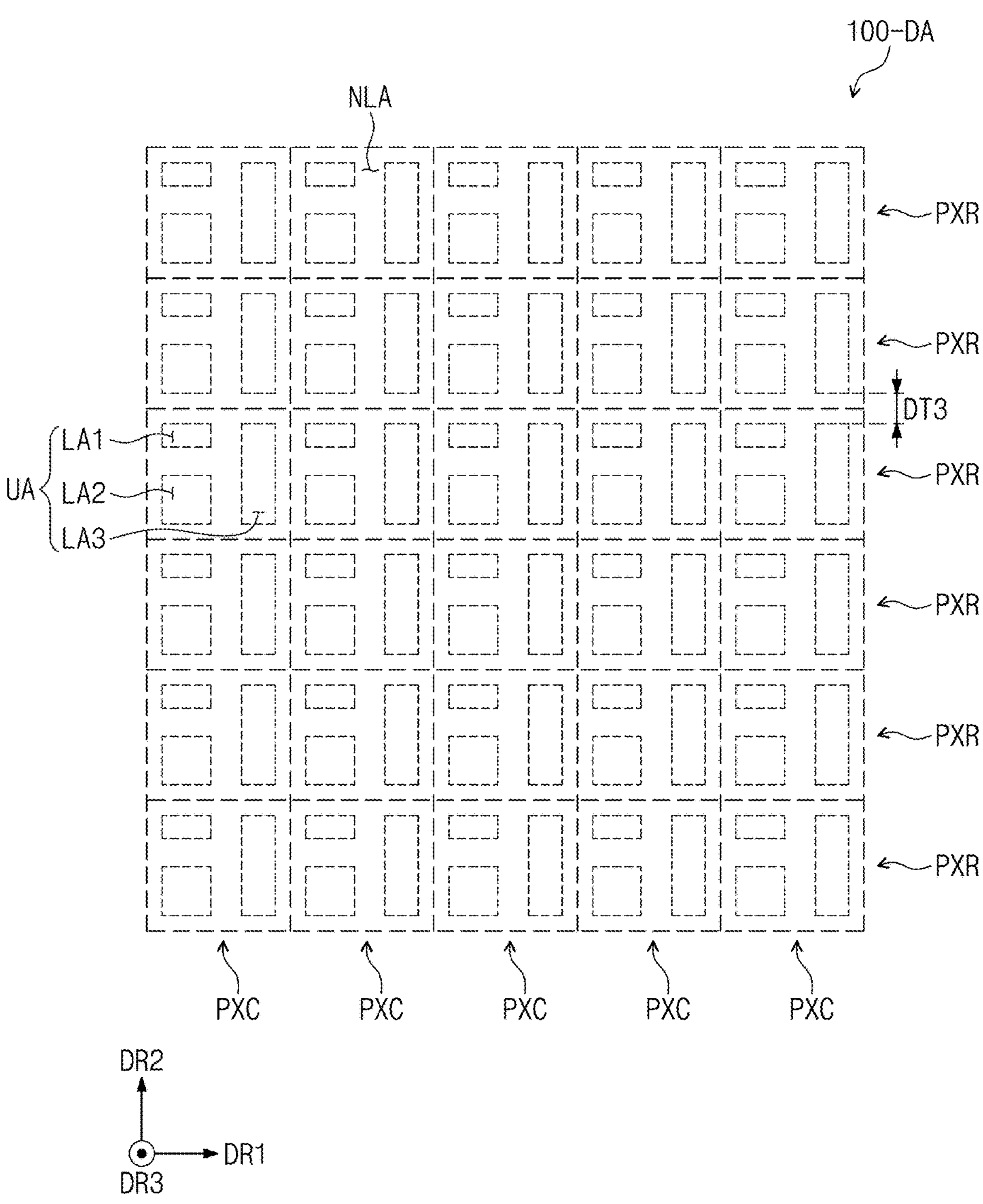
Figure 4C:
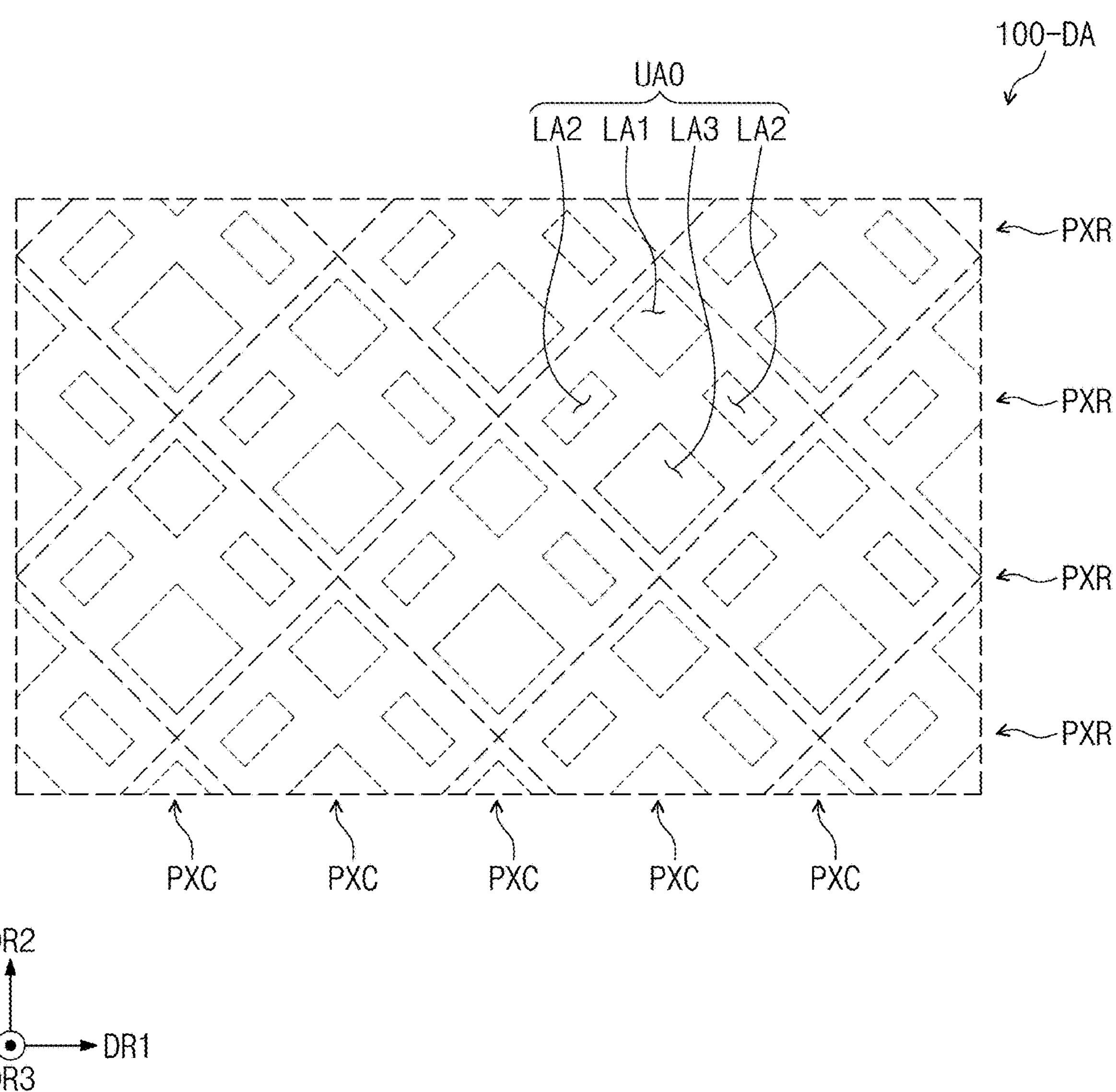

FIGS. 4A to 4C are enlarged cross-sectional views of the display area 100-DA according to embodiments of the present inventive concept.

Referring to FIG. 4A, the display area 100-DA may include a plurality of emission areas, such as first to third emission areas LA1, LA2, and LA3, and non-emission area NLA adjacent to the plurality of emission areas. The boundaries of the first to third emission areas LA1, LA2, and LA3 are set by the non-emission area NLA.

The first to third emission areas LA1, LA2, and LA3 may be disposed to be in one-to-one correspondence with the pixels PX of FIG. 3. Each of the pixels PX includes a light-emitting element, and light generated by the light-emitting elements may be emitted from the first to third emission areas LA1, LA2, and LA3.

In an embodiment, the emission areas may include the first emission area LA1 (e.g., a first color light-emitting area) in which first color light is generated, the second emission area LA2 (e.g., a second color light-emitting area) in which second color light is generated, and the third emission area LA3 (e.g., a third color light-emitting area). In an embodiment, the first color light may be red light, the second color light may be green light, and the third color light may be blue light. However, embodiments of the present inventive concept are not necessarily limited thereto.

In an embodiment, the first emission area LA1, the second emission area LA2, and the third emission area LA3 may have different areas from each other (e.g., in a plan view). However, embodiments of the present inventive concept are not necessarily limited thereto. In an embodiment, the area of the first emission area LA1 may be the smallest, and the area of the third emission area LA3 may be the largest.

The first emission area LA1, the second emission area LA2, and the third emission area LA3 may define one unit emission area UA. The unit emission area UA is a repeating arrangement unit of the emission areas in the display area 100-DA. In an embodiment, the unit emission area UA may include a first unit emission area UA1 and a second unit emission area UA2.

Referring to the first unit emission area UA1 and the second unit emission area UA2, in an embodiment the first emission area LA1 and the second emission area LA2 are arranged on one side (e.g., the left side in FIG. 4A) of the third emission area LA3 in the first direction DR1. The second emission area LA2 of each of the first unit emission area UA1 and the second unit emission area UA2 is arranged on one side (e.g., the lower side in FIG. 4A) of the first emission area LA1 in the second direction DR2.

The first unit emission area UA1 and the second unit emission area UA2 have different positions of the third emission area LA3 with respect to the first emission area LA1 and the second emission area LA2 in the second direction DR2. Referring to the first unit emission area UA1, the third emission area LA3 is positioned relatively lower than the first emission area LA1 in the second direction DR2. Referring to the second unit emission area UA2, the third emission area LA3 is positioned relatively higher than the first emission area LA1 and the second emission area LA2 in the second direction DR2. The first unit emission area UA1 and the second unit emission area UA2 may have different levels of shift of the third emission area LA3 with respect to the first emission area LA1 and the second emission area LA2 in the second direction DR2. In an embodiment, the third emission area LA3 may be relatively more shifted from the second unit emission area UA2 in the second direction DR2. However, embodiments of the present inventive concept are not necessarily limited thereto, and the degrees of shift of the third emission area LA3 from the first emission area LA1 and the second emission area LA2 may be the same in the second direction DR2.

In an embodiment, the first unit emission area UA1 and the second unit emission area UA2 may be alternately arranged along the first direction DR1 in a pixel row PXR. The first unit emission area UA1 and the second unit emission area UA2 may be alternately arranged along the second direction DR2 in a pixel column PXC. According to this arrangement of the first unit emission area UA1 and the second unit emission area UA2, the third emission areas LA3 of the first unit emission area UA1 and the second unit emission area UA1 are arranged in a prescribed rule. Two adjacent third emission areas LA3 of the first unit emission area UA1 and the second unit emission area UA2 are relatively closely separated from each other by a first interval DT1. The third emission areas LA3 separated by the first interval DT1 of the first unit emission area UA1 and the second unit emission area UA2 define a pair of emission areas UP. The pair of emission areas UP is separated from each other by a second interval DT2 in the pixel column PXC. The second interval DT2 may be greater than the first interval DT1.

In an embodiment, the pair of emission areas UP is provided due to a mask used in a deposition process. The light-emitting element in the third emission area LA3 of the first unit emission area UA1 and the light-emitting element in the third emission area LA3 of the second unit emission area UA2 include an integrated light-emitting layer. For example, the light-emitting layer in the third emission area LA3 of the first unit emission area UA1 and the light-emitting layer in the third emission area LA3 of the second unit emission area UA2 are integrated and deposited by means of one mask. Openings corresponding to the pairs of emission areas UP are defined in the mask. Areas between the openings of the mask correspond to blocking areas of the mask. Due to the defining of the openings corresponding to the pairs of emission areas UP, the number of openings is reduced, and the width of the blocking area between the openings of the mask may be secured. The mask of a thin film may be required to secure the width of the blocking area of the mask in the second direction DR2 to suppress a defect that the mask is stretched in the deposition process.

This may be understood by comparing a third interval DT3 between the third emission areas LA3 in FIG. 4B. Referring to FIG. 4B, unit emission areas UA of only one type are arranged in the display area 100-DA. The third interval DT3 between the third emission areas LA3 of the adjacent unit emission areas UA in the pixel column PXC is less than the second interval DT2 of FIG. 4A. A mask for providing the third emission areas LA3 of FIG. 4B has more openings than that of FIG. 4A, and thus the width of the blocking area of the mask is reduced relatively. This is due to the respective openings corresponding to the third emission areas LA3 shown in FIG. 4B being defined in the mask for providing the light-emitting layers.

In each of FIGS. 4A and 4B, the pixel columns in which the first emission areas LA1 and the second emission areas LA2 are alternately arranged along the second direction DR2 may be referred to as first unit pixel columns PXC-1. Pixel columns in which the third emission areas LA3 are arranged along the second direction DR2 may be referred to as second pixel columns PXC-2.

Referring to FIG. 4C, emission areas UA0 of one type are arranged in the display area 100-DA. In an embodiment, the unit emission areas UA0 includes the second emission areas LA2 spaced apart from each other in the first direction DR1, and the first emission areas LA1 and the third emission areas LA3 spaced apart from each other in the second direction DR2. The four emission areas LA1, LA2, and LA3 in the unit emission areas UA0 are arranged in a diamond shape (e.g., in a plan view). The unit emission areas UA0 of the pixel rows PXR are arranged along the first direction DR1.

The unit emission areas UA0 of the adjacent pixel rows PXR are staggered along the first direction DR1. The unit emission areas UA0 of the adjacent pixel columns PXC are staggered along the second direction DR2.

Figure 5:
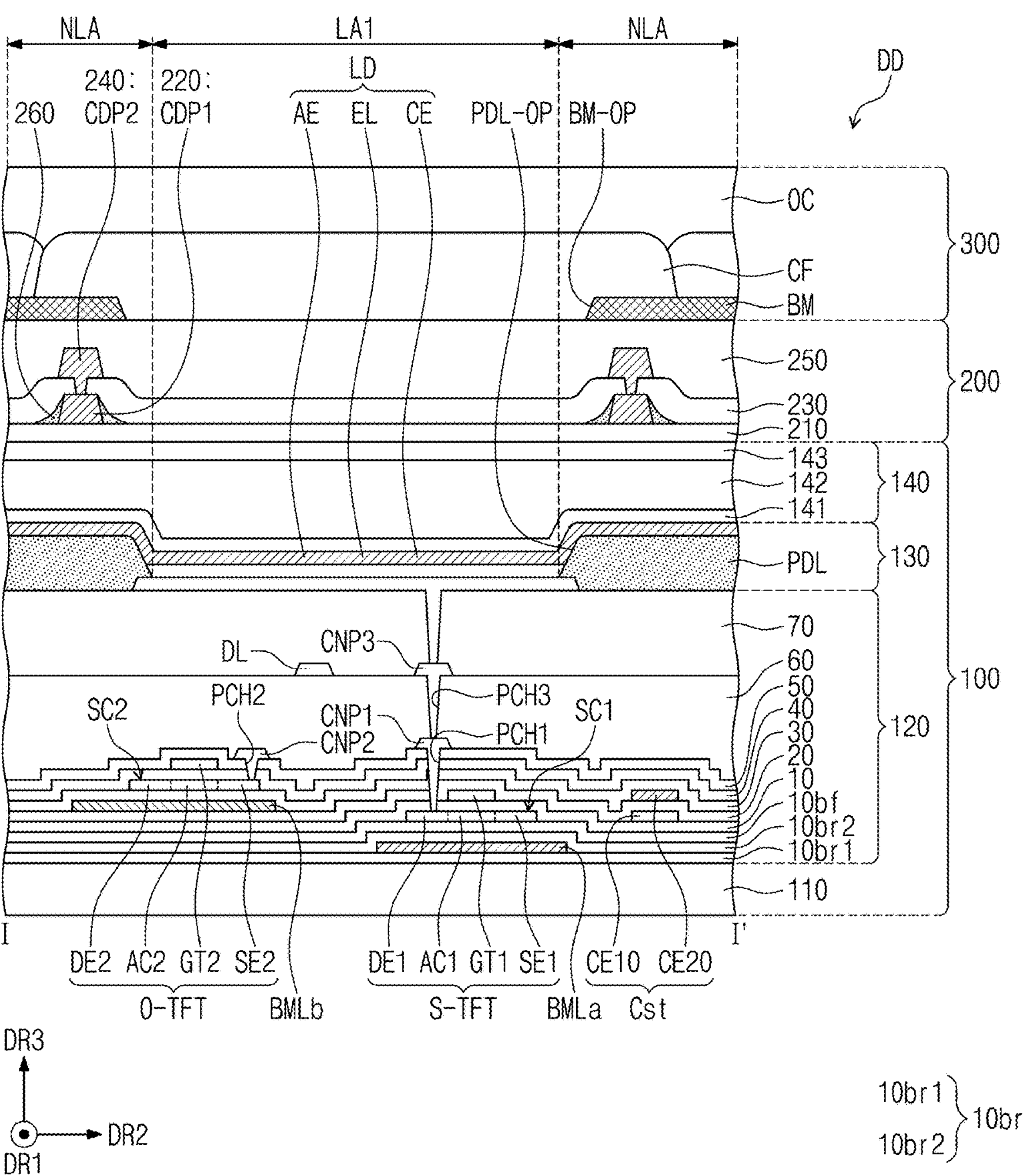
FIG. 5 is a cross-sectional view of a display device according to an embodiment of the present inventive concept.

FIG. 5 is a cross-sectional view of the display device DD according to an embodiment of the present inventive concept. FIG. 5 is a cross-sectional view of the display device DD corresponding to line I-I' of FIG. 4A. In FIG. 5, some components, for example, the adhesive layer PSA and the window WM of the display device DD of FIG. 2 are not shown for convenience of explanation.

In an embodiment, the pixel driving circuit PC configured to drive the light-emitting element LD may include a plurality of pixel driving elements. In an embodiment, the pixel driving circuit PC may include a plurality of transistors S-TFT and O-TFT, and a capacitor Cst. FIG. 5 illustrates a silicon transistor S-TFT and an oxide transistor O-TFT as example transistors. However, the pixel driving circuit PC of FIG. 5 is merely an example and the configuration of the pixel driving circuit PC is not necessarily limited thereto. For example, the pixel driving circuit PC may also include only one type transistor between the silicon transistor S-TFT and the oxide transistor O-TFT.

Referring to FIG. 5, the base layer 110 is shown as a single layer. In an embodiment, the base layer 110 may include a synthetic resin such as polyimide. In an embodiment, the base layer 110 may be provided by coating a synthetic resin layer on a work substrate (e.g., a carrier substrate). When subsequent processes are performed to complete the display module DM, the work substrate may then be removed. The base layer 110 in an embodiment of the present inventive concept may also have a multilayer structure including a first synthetic resin layer, at least one inorganic layer, and a second synthetic resin layer.

Referring to FIG. 5, a barrier layer 10*br* may be disposed on the base layer 110 (e.g., disposed directly thereon in the third direction DR3). The barrier layer 10*br* prevents a foreign matter from entering from the outside (e.g., the external environment). The barrier layer 10*br* may include at least one inorganic layer. In an embodiment, the barrier layer 10*br* may include a silicon oxide layer and a silicon nitride layer. Each of the layers of the barrier layer 10*br* may be provided in plural, and the silicon oxide layers and the silicon nitride layers may be alternately stacked (e.g., in the third direction DR3).

In an embodiment, the barrier layer 10*br* may include a lower barrier layer 10*br*1 and an upper barrier layer 10*br*2. A first shield electrode BMLa may be disposed between the lower barrier layer 10*br*1 and the upper barrier layer 10*br*2 (e.g., in the third direction DR3). The first shield electrode BMLa may be disposed corresponding to the silicon transistor S-TFT. In an embodiment, the first shield electrode BMLa may include metal, for example, molybdenum.

The first shield electrode BMLa may receive a bias voltage. The first shield electrode BMLa may also receive the first power supply voltage. The first shield electrode BMLa may shield an electric potential caused by a polarization phenomenon from influencing the silicon transistor S-TFT. The first shield electrode BMLa may shield external light from reaching the silicon transistor S-TFT. In an embodiment of the present inventive concept, the first shield electrode BMLa may be a floating electrode isolated from another electrode or wiring.

A buffer layer 10*bf* may be disposed on the barrier layer 10*br* (e.g., disposed directly thereon in the third direction DR3). The buffer layer 10*bf* may prevent a phenomenon in which metal atoms or impurities diffuse to an upper first semiconductor pattern SC1. The buffer layer 10*bf* may include at least one inorganic layer. In an embodiment, the buffer layer 10*bf* may include silicon oxide layers and a silicon nitride layers.

The first semiconductor pattern SC1 may be disposed on the buffer layer 10*bf*(e.g., disposed directly thereon in the third direction DR3). In an embodiment, the first semiconductor pattern SC1 may include a silicon semiconductor. For example, the silicon semiconductor may include amorphous silicon, polycrystalline, or the like. For example, the first semiconductor pattern SC1 may include low temperature polysilicon.

The first semiconductor pattern SC1 may have different electrical properties according to whether it is doped or non-doped. The first semiconductor pattern SC1 may include a first area having high conductivity and a second area having low conductivity. The first area may be doped with an N-type dopant or a P-type dopant. The second area may be a non-doped area, or be doped in a low concentration in relative to the first area. A source area SE1, a channel area AC1 (e.g., active area), and a drain area DE1 of the silicon transistor S-TFT may be provided from the first semiconductor pattern SC1. In the cross-sectional view, the source area SE1 and the drain area DE1 may extend from the channel area AC1 in opposite directions from each other.

The first insulation layer 10 may be disposed on the buffer layer 10*bf* (e.g., disposed directly thereon in the third direction DR3). The first insulation layer 10 may cover the first semiconductor pattern SC1. The first insulation layer 10 may be an inorganic layer. The first insulation layer 10 may be a silicon oxide layer of a single layer. In an embodiment, not only the first insulation layer 10 but also the inorganic layer of the driving element layer 120 to be described later may have a single layer or multi-layer structure, and include at least one of the above-described materials. However, embodiments of the present inventive concept are not necessarily limited thereto.

A gate GT1 of the silicon transistor S-TFT is disposed on the first insulation layer 10 (e.g., disposed directly thereon in the third direction DR3). The gate GT1 may be a portion of a metal pattern. The gate GT1 overlaps the channel area AC1 (e.g., in the third direction DR3). In an embodiment, the gate GT1 may be a mask in a process for doping the first semiconductor pattern SC1. A first electrode CE10 of the storage capacitor Cst is disposed on the first insulation layer 10 (e.g., disposed directly thereon in the third direction DR3). However, embodiments of the present inventive concept are not necessarily limited thereto. For example, in an embodiment the first electrode CE10 may have an integral shape with the gate GT1.

The second insulation layer 20 may be disposed on the first insulation layer 10 (e.g., disposed directly thereon in the third direction DR3) and cover the gate GT1. In an embodiment of the present inventive concept, an upper electrode overlapping the gate GT1 (e.g., in the third direction DR3) may be further disposed on the second insulation layer 20. A second electrode CE20 overlapping the first electrode CE10 (e.g., in the third direction DR3) may be disposed on the second insulation layer 20 (e.g., disposed directly thereon in the third direction DR3). In an embodiment, the upper electrode and the second electrode CE20 may have an integral shape in a plan view.

A second shield electrode BMLb is disposed on the second insulation layer 20 (e.g., disposed directly thereon in the third direction DR3). The second shield electrode BMLa may be disposed corresponding to the oxide transistor O-TFT. However, embodiments of the present inventive concept are not necessarily limited thereto. For example, in an embodiment the second shield electrode BMLb may be omitted. According to an embodiment of the present inventive concept, the first shield electrode BMLa extends to the bottom of the oxide transistor O-TFT to replace the second shield electrode BMLb.

A third insulation layer 30 may be arranged on the second insulation layer 20 (e.g., disposed directly thereon in the third direction DR3). The second semiconductor pattern SC2 may be disposed on the third insulation layer 30 (e.g., disposed directly thereon in the third direction DR3). The second semiconductor pattern SC2 may include the channel area AC2 of the oxide transistor O-TFT. The second semiconductor pattern SC2 may include a metal-oxide semiconductor. In an embodiment, the second semiconductor pattern SC2 may include a transparent conductive oxide (TCO) such as indium tin oxide (ITO), Indium zinc oxide (IZO), indium-gallium-zinc oxide (IGZO), zinc oxide (ZnOx) or indium oxide (In2O3).

The metal-oxide semiconductor may include a plurality of areas SE2, AC2, and DE2 divided according to whether the TCO is reduced. An area in which the TCO is reduced (hereinafter, a reduction region) has a high conductivity relative to an area in which the metal oxide is not reduced (hereinafter, a non-reduction region). The reduction region may substantially serve as a source/drain or a signal line of the transistor. The non-reduction region substantially corresponds to a semiconductor region (e.g., a channel) of a transistor. A fourth insulation layer 40 may be disposed on the third insulation layer 30 (e.g., disposed directly thereon in the third direction DR3). As shown in FIG. 5, the fourth insulation layer 40 may cover the second semiconductor pattern SC2. In an embodiment of the present inventive concept, the fourth insulation layer 40 may be an insulation pattern overlapping the gate GT2 of the oxide transistor O-TFT and configured to expose the source area SE2 and the drain area DE2 of the oxide transistor O-TFT The gate GT2 of the oxide transistor O-TFT is disposed on the fourth insulation layer 40 (e.g., disposed directly thereon in the third direction DR3). The gate GT2 of the oxide transistor O-TFT may be a portion of a metal pattern. The gate GT2 of the oxide transistor O-TFT may overlap the channel area AC2 (e.g., in the third direction DR3). A fifth insulation layer 50 may be disposed on the fourth insulation layer 40 and cover the gate GT2. In an embodiment, each of the first to fifth insulation layers 10 to 50 may be an inorganic layer.

The first connection pattern CNP1 and the second connection pattern CNP2 may be disposed on the fifth insulation layer 50 (e.g., disposed directly thereon in the third direction DR3). In an embodiment, the first connection pattern CNP1 and the second connection pattern CNP2 are provided through the same process, and thus may have the same materials and laminate structure. The first connection pattern CNP1 may be connected to the drain area DE1 of the silicon transistor S-TFT through a first pixel contact hole PCH1 penetrating through the first to fifth insulation layers 10, 20, 30, 40, and 50. The second connection pattern CNP2 may be connected to the source area SE2 of the oxide transistor O-TFT through a second pixel contact hole PCH2 penetrating through the fourth and fifth insulation layers 40 and 50. However, embodiments of the present inventive concept are not necessarily limited thereto and the connection relations of the first connection pattern CNP1 and the second connection pattern CNP2 to the silicon transistor S-TFT and the oxide transistor O-TFT may vary.

A sixth insulation layer 60 may be disposed on the fifth insulation layer 50 (e.g., disposed directly thereon in the third direction DR3). The third connection pattern CNP3 may be disposed on the sixth insulation layer 60 (e.g., disposed directly thereon in the third direction DR3). The third connection pattern CNP3 may be connected to the first connection pattern CNP1 through a third pixel contact hole PCH3 penetrating through the sixth insulation layer 60. A data line DL may be disposed on the sixth insulation layer 60 (e.g., disposed directly thereon in the third direction DR3). A seventh insulation layer 70 may be disposed on the sixth insulation layer 60, and cover the third connection pattern CNP3 and the data line DL. In an embodiment, the third connection pattern CNP3 and the data line DL are provided through the same process, and thus may have the same materials and laminate structure. In an embodiment, each of the sixth and seventh insulation layers 60 and 70 may be an organic layer.

In an embodiment, the light-emitting element LD may include an anode AE (e.g., a first electrode), a light-emitting layer EL, and a cathode CE (e.g., a second electrode). The anode AE1 of the light-emitting element LD may be disposed on the seventh insulation layer 70 (e.g., disposed directly thereon in the third direction DR3). In an embodiment, the anode AE may be a (semi-) transmissive electrode or a reflection electrode. For example, the anode AE may include a laminate structure in which ITO/Ag/ITO are sequentially laminated. The positions of the anode AE and the cathode CE may be exchanged with each other.

A pixel definition layer PDL may be disposed on the seventh insulation layer 70 (e.g., disposed directly thereon in the third direction DR3). In an embodiment, the pixel definition layer PDL may be an organic layer. The pixel definition layer PDL may have light absorption property, and have a block color. The pixel definition layer PDL may include a black coloring agent. The black coloring agent may include a black dye or a black pigment. In an embodiment, the black coloring agent may include carbon black, a metal such as chromium, or an oxide thereof. The pixel definition layer PDL may correspond to a light shielding pattern having light-blocking property.

The pixel definition layer PDL may cover a portion of the anode AE, such as ends of the anode AE. For example, an opening PDL-OP configured to expose a portion of the anode AE may be defined in the pixel definition layer PDL. For example, in an embodiment the opening PDL-OP may expose a central portion of the anode AE. The emission area LA1 may be defined to correspond to the opening PDL-OP. The opening PDL-OP in the pixel definition layer PDL may be described as “a light-emitting opening”. FIG. 5 illustrates one emission area LA1 corresponding to the first emission area LA1 of FIG. 4A. The cross-section corresponding to the second emission areas LA2 and the third emission areas LA3 of FIG. 4A may be substantially same as that of FIG. 5. However, in some embodiments the second emission areas LA2 and the third emission areas LA3 may include a light-emitting layer EL having different materials from the first emission areas LA1. In addition, referring to the pair of emission areas UP of FIG. 4A, the pixel definition layer PDL is disposed between the third emission area LA3 of the first unit emission area UA1 and the third emission area LA3 of the second unit emission area UA2. The light-emitting layer EL disposed in the third emission area LA3 of the first unit emission area UA1 and the third emission area LA3 of the second unit emission area UA2 may be disposed on the pixel definition layer PDL disposed therebetween.

In an embodiment of the present inventive concept, a hole control layer may be disposed between the anode AE1 and the light-emitting layer EL (e.g., in the third direction DR3). The hole control layer HCL may include a hole transport layer, and further include a hole injection layer. An electron control layer may be disposed between the light-emitting layer EL and the cathode CE (e.g., in the third direction DR3). The electron control layer may include an electron transport layer, and further include an electron injection layer.

The encapsulation layer 140 may cover the light-emitting element LD. In an embodiment, the encapsulation layer 140 may include an inorganic encapsulation layer 141, an organic encapsulation layer 142, and an inorganic encapsulation layer 143 that are sequentially laminated. However embodiments of the present inventive concept are not necessarily limited thereto and the layers constituting the encapsulation layer 140 may vary. In an embodiment, the inorganic encapsulation layers 141 and 143 may include a silicon nitride layer, a silicon oxynitride layer, a silicon oxide layer, a titanium oxide layer, an aluminum oxide layer or the like. Each of the inorganic encapsulation layers 141 and 143 may also have a multilayer structure. The organic encapsulation layer 142 may include an acrylic-based organic layer. However, embodiments of the present inventive concept are not necessarily limited thereto.

The input sensor 200 includes a plurality of conductive patterns. The input sensor 200 may include at least one conductive layer (e.g., at least one sensor conductive layer) including a plurality of conductive patterns, and at least one insulation layer (e.g., at least one sensor insulation layer). In an embodiment, the input sensor 200 may include a first sensor insulation layer 210, a first sensor conductive layer 220, a second sensor insulation layer 230, a second sensor conductive layer 240, and a third sensor insulation layer 250. FIG. 5 briefly illustrates a plurality of conductive patterns included in each of the first sensor conductive layer 220 and the second sensor conductive layer 240. In an embodiment, the first sensor conductive layer 220 may include a plurality of first conductive patterns CDP1, and the second sensor conductive layer 240 may include a plurality of second conductive patterns CDP2.

The first sensor insulation layer 210 may be disposed directly on the display panel 100 (e.g., in the third direction DR3). For example, the first sensor insulation layer 210 may be disposed directly on the encapsulation layer 140, such as the inorganic encapsulation layer 143. In an embodiment, the first sensor insulation layer 210 may be an inorganic layer including any one of silicon nitride, silicon oxynitride, or silicon oxide. Each of the first sensor conductive layer 220 and the second sensor conductive layer 240 may have a single layer structure or a multilayer structure laminated along the third direction DR3. Each of the first sensor conductive layer 220 and the second sensor conductive layer 240 may include conductive lines configured to define a meshed electrode. The conductive lines of the first sensor conductive layer 220 and the conductive lines of the second sensor conductive layer 240 may be or may not be connected through a contact hole configured to penetrate through the second sensor insulation layer 230 depending on their positions.

Each of the single-layered first sensor conductive layer 220 and the single-layered second sensor conductive layer 240 may include a metal layer or a transparent conductive layer. In an embodiment, the metal layer may include molybdenum, silver, titanium, copper, aluminum, or an alloy thereof. The transparent conductive layer may include a TCO such as indium tin oxide (ITO), Indium zinc oxide (IZO), zinc oxide (ZnOx), or indium-zinc-tin oxide (IZTO). In an embodiment, the transparent conductive layer may include a conductive polymer such as PEDOT, a metal nano-wire, or graphene.

Each of the multi-layered first conductive layer 220 and the multi-layered second conductive layer 240 may include a plurality of metal layers. For example, in an embodiment the metal layers may have a three-layered structure of titanium/aluminum/titanium. Alternatively, the multi-layered conductive layer may include at least one metal layer and at least one transparent conductive layer.

The second sensor insulation layer 230 may be disposed between the first sensor conductive layer 220 and the second sensor conductive layer 240 (e.g., in the third direction DR3). The second sensor insulation layer 230 may cover a plurality of first conductive patterns CDP1 included in the first sensor conductive layer 220. The third sensor insulation layer 250 may cover a plurality of second conductive patterns CDP2 included in the second sensor conductive layer 240. However, embodiments of the present inventive concept are not necessarily limited thereto. For example, in an embodiment the third sensor insulation layer 250 may be omitted. The third sensor insulation layer 250 may be replaced with an insulation layer of the optical layer 300, disposed on the adhesive layer or the input sensor 200. The second sensor insulation layer 230 and the third sensor insulation layer 250 each may include an inorganic layer or an organic layer.

In an embodiment, the input sensor 200 includes an organic pattern 260 disposed on side surfaces (e.g., lateral side surfaces) of at least a portion of the plurality of conductive patterns. The organic pattern 260 includes an organic binder.

In an embodiment, the organic pattern 260 includes concave slope surfaces with a decreasing gradient from a top of the organic pattern 260 to a bottom of the organic pattern 260 in a thickness direction of the display device DD, such as the third direction DR3. As shown in FIG. 5, the side surfaces of the organic pattern 260 may be the concave slope surfaces with intermediate portions sloped towards the first conductive pattern CDP1. The shape and inclusion materials of the organic pattern 260 will be described in detail with reference to FIGS. 7A and 7B.

The optical layer 300 may be disposed on the input sensor 200 (e.g., disposed directly thereon in the third direction DR3). In an embodiment, the optical layer 300 may include a light-blocking pattern BM, a color filter CF, and a planarization layer OC.

A material defining the light-blocking pattern BM may include various materials that absorb light. For example, in an embodiment the light-blocking pattern BM may be a layer having black color and include a black coloring agent. The black coloring agent may include a black dye or a black pigment. The black coloring agent may include carbon black, a metal such as chromium, or an oxide thereof.

The light-blocking pattern BM may overlap the first conductive patterns CDP1 and the second conductive patterns CDP2 in a plan view. The light-blocking pattern BM may prevent reflection of external light caused by the first conductive patterns CDP1 and the second conductive patterns CDP2. In an embodiment, an opening BM-OP may be defined in the light-blocking pattern BM. The opening BM-OP of the light-blocking pattern BM may overlap the anode AE and have a larger area (e.g., in a plan view) than the opening PDL-OP of the pixel definition layer PDL.

The color filter CF may at least overlap the emission area (e.g., in the third direction DR3). A portion of the color filter CF may further overlap the non-emission area NLA (e.g., in the third direction DR3). A portion of the color filter CF may be disposed on the light-blocking pattern BM (e.g., disposed directly thereon). The color filter CF may pass light generated by the light-emitting element LD and block some wavelength bands of the external light. Accordingly, the color filter CF may reduce the reflection of external light caused by the anode AE or the cathode CE.

The planarization layer OC may cover the light-blocking pattern BM and the color filter CF. In an embodiment, the planarization layer OC may include an organic material, and provide a planar top surface.

Figure 6A:
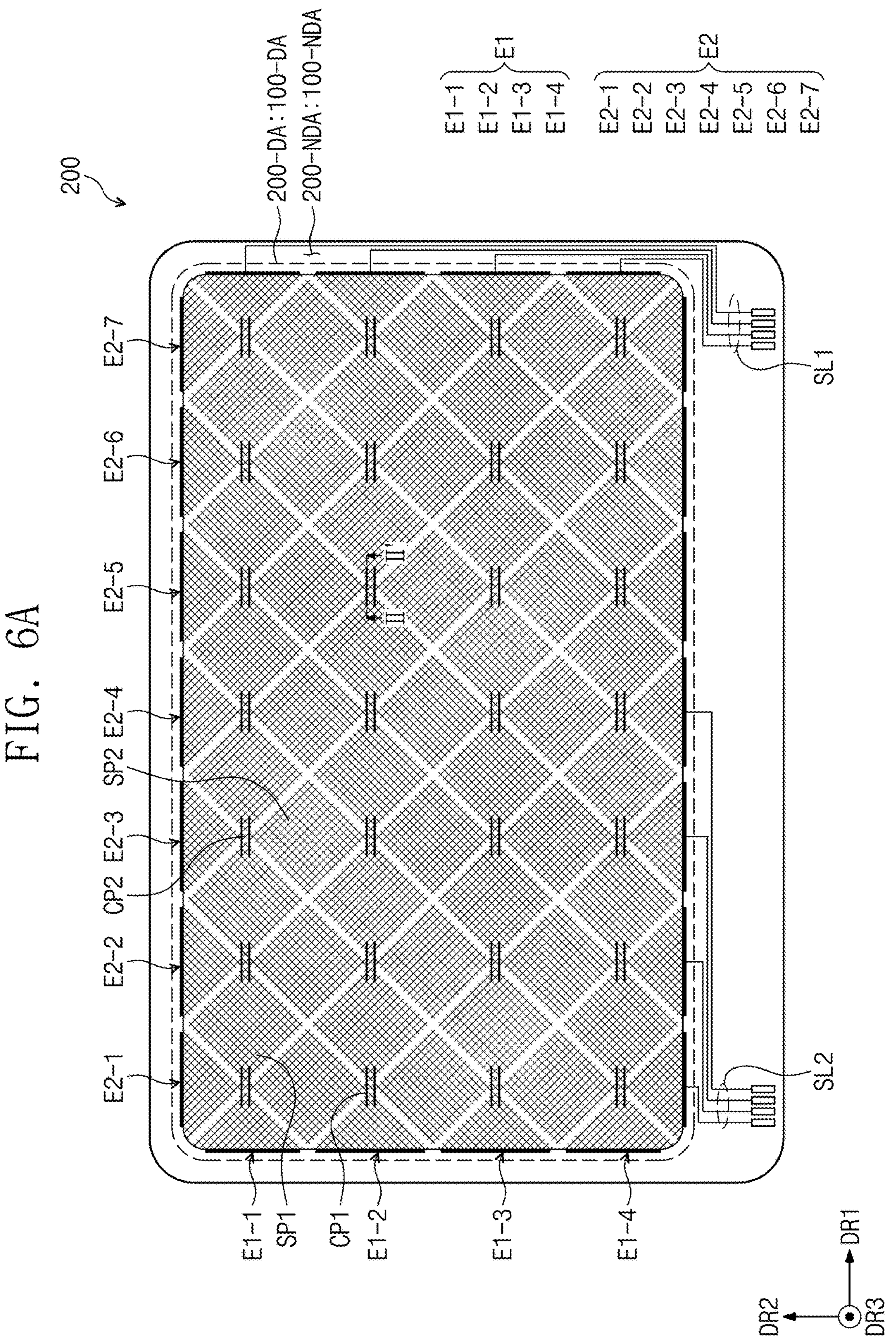
FIG. 6A is a plan view of an input sensor according to according to an embodiment of the present inventive concept.
Figure 6B:
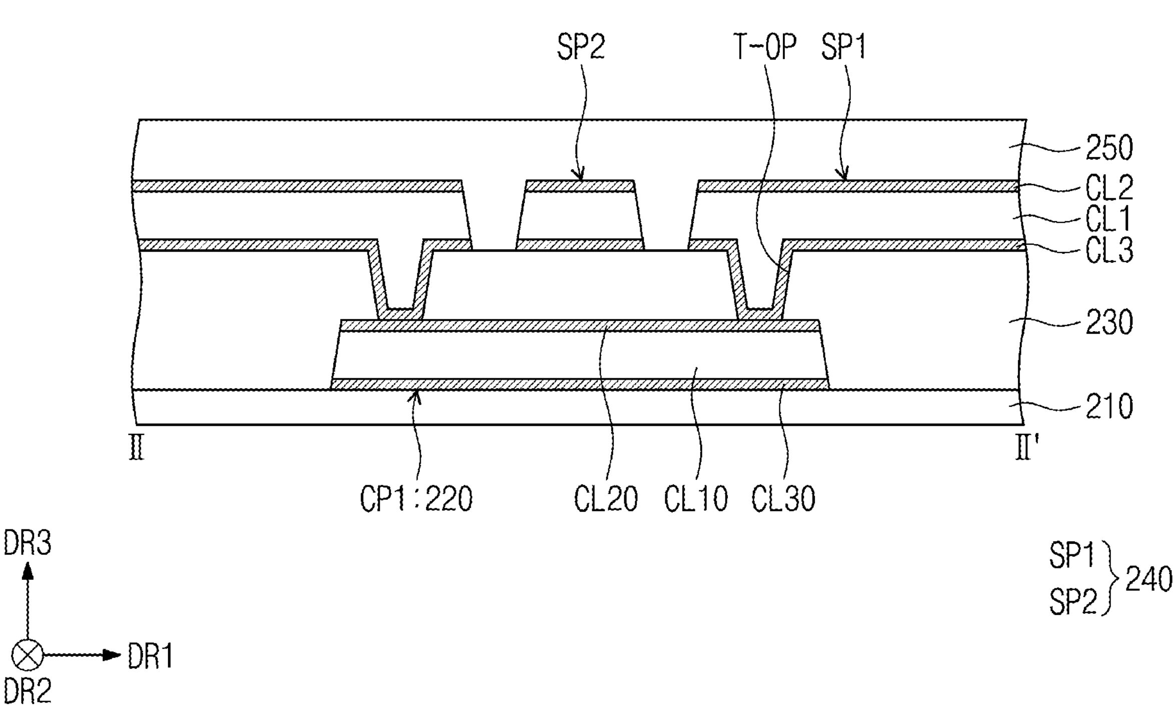
FIG. 6B is a cross-sectional view of an input sensor according to an embodiment of the present inventive concept.

FIG. 6A is a plan view of the input sensor 200 according to an embodiment of the present inventive concept. FIG. 6B is a cross-sectional view of the input sensor 200 according to an embodiment of the present inventive concept. FIG. 6B may be a cross-sectional view of the input sensor 200 corresponding to line II-II' of FIG. 6A.

As shown in FIG. 6A, in an embodiment the input sensor 200 includes a detection area 200-DA and a non-detection area 200-NDA adjacent to the detection area 200-DA (e.g., in the first and second directions DR1, DR2). The detection area 200-DA and the non-detection area 200-NDA respectively correspond to the display area 100-DA and the non-display area 100-NDA shown in FIG. 5.

The input sensor 200 includes the above-described plurality of conductive patterns. The plurality of conductive patterns include first electrodes E1 (e.g., first detection electrodes), second electrodes E2 (e.g., second detection electrodes), first signal lines SL1 (e.g., first sensor signal lines), and second signal lines SL2 (e.g., second sensor signal lines).

The first detection electrodes E1 and the second detection electrodes E2 insulated therefrom and crossing therewith are disposed in the detection area 200-DA. The first signal lines SL1 electrically connected to the first detection electrodes E1 and the second signal lines SL2 electrically connected to the second detection electrodes E2 are disposed in the non-detection area 200-NDA. One of the first detection electrodes E1 and the second detection electrodes E2 transfer a driving signal for detecting an external input from an external circuit to the corresponding electrodes, and the other one output a sensing signal. A change in electrostatic capacitance is measured between the first detection electrodes E1 and the second detection electrodes E2 on the basis of the sensing signal. In an embodiment, an example mutual capacitive input sensor is shown. However, embodiments of the present inventive concept are not necessarily limited thereto. A self-capacitive input sensor may also be applied in some embodiments. The self-capacitive input sensor may include sensing electrodes of one type.

In an embodiment, the first sensing electrodes E1 may be provided in a plurality of rows. The first sensing electrodes E1 may include first row sensing electrodes E1-1, second row sensing electrodes E1-2, third row sensing electrodes E1-3, and fourth row sensing electrodes E1-4. However, embodiments of the present inventive concept are not necessarily limited thereto and the number of the first and second sensing electrodes E1, E2 may vary. For example, in an embodiment the first sensing electrodes E1 may include two or three row sensing electrodes or five or more row sensing electrodes.

The second sensing electrodes E2 may be provided in a plurality of columns. The second sensing electrodes E2 may include a first column sensing electrode E2-1, a second column sensing electrode E2-2, a third column sensing electrode E2-3, a fourth column sensing electrode E2-4, a fifth column sensing electrode E2-5, a sixth column sensing electrode E2-6, and a seventh column sensing electrode E2-7. However, in some embodiments the second sensing electrodes E2 may include at least six column sensing electrodes or eight or more column sensing electrodes.

In an embodiment, each of the first sensing electrodes E1 and the second sensing electrodes E2 may have a mesh shape having a plurality of opening areas defined therein. The plurality of opening areas may overlap the corresponding emission areas among the plurality of the emission areas LA1, LA2, and LA3 of FIG. 4A. The second sensing electrodes E2 may be insulated from and cross with the first sensing electrodes E1. In an embodiment, each of the first sensing electrodes E1 and the second sensing electrodes E2 may have an integral shape. For example, example integral second sensing electrodes E2 are shown in FIG. 6A.

In an embodiment, the second sensing electrodes E2 may include the second sensing patterns SP2 and connection patterns CP2. The second sensing patterns SP2 may have a larger area than the connection patterns CP2 and be in a diamond shape (e.g., in a plan view). Each of the connection patterns CP2 may be disposed between two adjacent second sensing patterns SP2 among the second sensing patterns SP2. The length of the connection patterns may be relatively short. However, embodiments of the present inventive concept are not necessarily limited thereto, and the connection patterns CP2 may be omitted in some embodiments. Here, the second sensing patterns SP2 may directly extend from an adjacent second sensing pattern SP2.

Each of the first sensing electrodes E1 may include the first sensing patterns SP1 and bridge patterns CP1. The two adjacent first sensing patterns SP1 may be connected by means of the two bridge patterns CP1. However, embodiments of the present inventive concept are not necessarily limited thereto and the number of the bridge patterns may vary.

Referring to FIGS. 6A and 6B, in an embodiment the bridge patterns CP1 among the above-described plurality of conductive patterns may be disposed on the first layer, and the first and second sensing patterns SP1 and SP2 may be disposed on the second layer different from the first layer. In an embodiment, the bridge patterns CP1 may be provided from the first sensor conductive layer 220, and the first sensing patterns SP1 and the second sensing patterns SP2 may be provided from the second sensor conductive layer 240. In an embodiment, the bridge patterns CP1 may be connected to the first sensing patterns SP1 through the contact hole T-OP provided in the second sensor insulation layer 230. However, embodiments of the present inventive concept are not necessarily limited thereto. For example, in an embodiment the bridge patterns CP1 may be provided from the second sensor conductive layer 240, and the first sensing patterns SP1 and the second sensing patterns SP2 may be provided from the first sensor conductive layer 220.

In an embodiment, the first sensor conductive layer 220 may include a first lower conductive layer CL10, a second lower conductive layer CL20 disposed above the first lower conductive layer CL10 and directly contacting the first lower conductive layer CL10, and a third lower conductive layer CL30 disposed under the first lower conductive layer CL10 and directly contacting the first lower conductive layer CL10. However, embodiments of the present inventive concept are not necessarily limited thereto. For example, in an embodiment the third lower conductive layer CL30 may be omitted. In an embodiment, the first lower conductive layer CL10 and the second lower conductive layer CL20 may be comprised of different materials from each other. For example, in an embodiment, the first lower conductive layer CL10 may have a first reflectance, a first conductivity, and a first thickness. The second lower conductive layer CL20 may have a second reflectance lower than the first reflectance, a second conductivity lower than the first conductivity, and a second thickness less than the first thickness. The first lower conductive layer CL10 having low resistance substantially corresponds to a signal transfer path. In the input sensor 200 in an embodiment, a plurality of conductive patterns may be disposed in a relatively narrow area in a plan view by increasing the thickness by means of the three-layer structure. The second lower conductive layer CL20 of a lower reflectance may cover the first lower conductive layer to lower the reflectance of external light.

In an embodiment, the second sensor conductive layer 240 may include a first upper conductive layer CL1, a second upper conductive layer CL2 disposed above the first upper conductive layer CL1 and directly contacting the first upper conductive layer CL1, and a third upper conductive layer CL3 disposed under the first upper conductive layer CL1 and directly contacting the first upper conductive layer CL1. In an embodiment, the first upper conductive layer CL1 of the second sensor conductive layer 240 may include the same material and have the same thickness as the first lower conductive layer CL10 of the first sensor conductive layer 220. The second upper conductive layer CL2 of the second sensor conductive layer 240 may include the same material and have the same thickness as the second lower conductive layer CL20 of the first sensor conductive layer 220. The third upper conductive layer CL3 of the second sensor conductive layer 240 may include the same material and have the same thickness as the third lower conductive layer CL30 of the first sensor conductive layer 220.

In an embodiment, each of the first signal lines SL1 and the second signal lines SL2 may be provided from the first sensor conductive layers 220 of FIG. 5. However, embodiments of the present inventive concept are not necessarily limited thereto, and each of the first signal lines SL1 and the second signal lines SL2 may be provided from the second sensor conductive layers 240. Each of the first signal lines SL1 and the second signal lines SL2 may have a dual interconnection structure including all lines provided from the first sensor conductive layer 220 and the second sensor conductive layer 240.

Figure 7A:
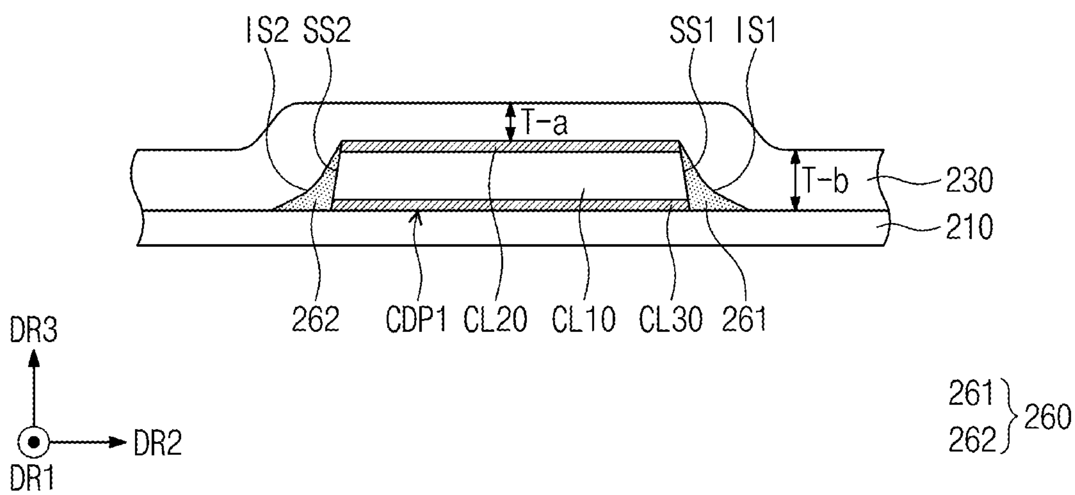
FIG. 7A is an enlarged cross-sectional view of a portion of an input sensor according to an embodiment of the present inventive concept.
Figure 7B:
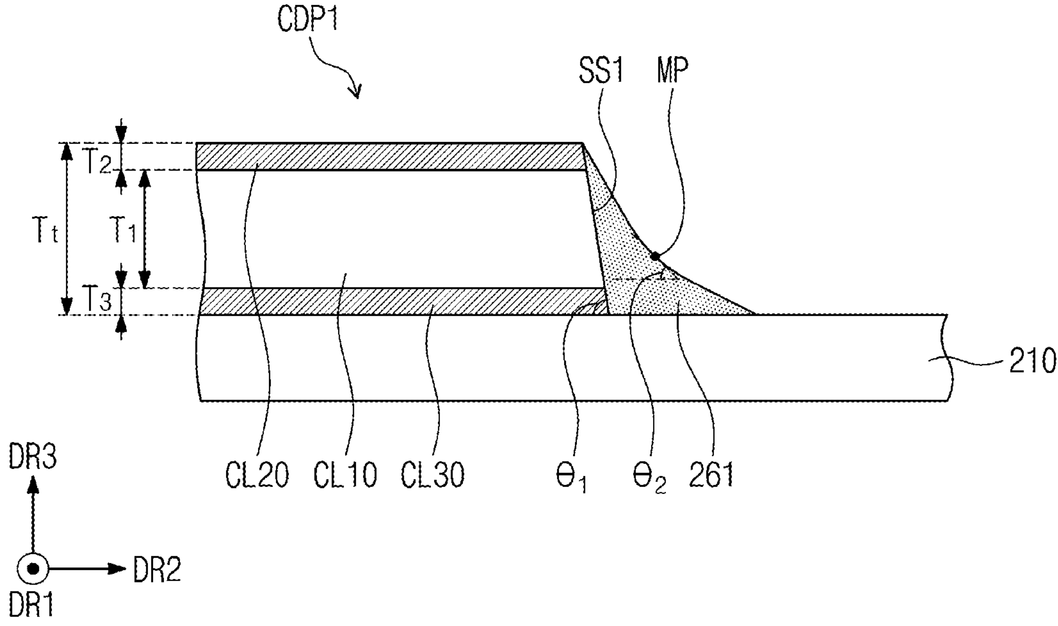
FIG. 7B is an enlarged cross-sectional view of some components in a portion of an input sensor according to an embodiment of the present inventive concept.

FIG. 7A is an enlarged cross-sectional view of a portion of the input sensor according to an embodiment of the present inventive concept. FIG. 7B is an enlarged cross-sectional view of some components in a portion of the input sensor according to an embodiment of the present inventive concept. FIGS. 7A and 7B illustrate enlarged arrangement shapes of a first conductive pattern CDP1 among the plurality of first conductive patterns CDP1 shown in FIG. 5, and the organic pattern 260 arranged adjacent thereto.

Referring to FIGS. 5 and 7A, the first conductive pattern CDP1 is disposed on the first sensor insulation layer 210 (e.g., disposed directly thereon in the third direction DR3). The first conductive pattern CDP1 may be disposed directly on the first sensor insulation layer 210.

The organic pattern 260 is arranged on the side surfaces (e.g., lateral ends) of the first conductive pattern CDP1. The organic pattern 260 may be disposed directly on the side surfaces of each of the first conductive patterns CDP1 provided in plurality. In an embodiment, the first conductive pattern CDP1 may include a first side surface SS1 and a second side surface SS2 spaced apart from and facing each other in one direction, such as the second direction DR2, and the organic pattern 260 may be arranged directly on the first side surface SS1 and the second side surface SS2. The organic pattern 260 may directly contact the first side surface SS1 and the second side surface SS2. In an embodiment, the organic pattern 260 may include a first organic pattern 261 directly contacting the first side surface SS1, and a second organic pattern 262 directly contacting the second side surface SS2.

The organic pattern 260 includes an organic binder. In an embodiment, the organic binder included in the organic pattern 260 includes at least one compound selected from polyimide, polyamide, polybenzimidazole, polybenzothiazole, polybenzoxazole, polybenzobisxazole, and polyamide-imide. For example, the organic binder includes polyimide.

The organic pattern 260 may include a mixture in which a plurality of polymer materials are mixed. For example, in an embodiment the organic pattern 260 may include polyimide and a material in which one among polybenzimidazole, polybenzothiazole, polybenzoxazole, polybenzobisxazole, or polyamide-imide is fluorinated. The organic pattern 260 may include a mixture in which polyimide and the fluorinated polybenzoxazole are mixed.

In an embodiment, the organic pattern 260 may include an optically transparent material. The organic pattern 260 may be optically transparent in the visible ray wavelength region. For example, in an embodiment the organic pattern 260 has the transmittance in a range of about 85% to about 97% in the visible ray wavelength region. In an embodiment, the organic pattern 260 may not include a separate light-blocking material, but include a transparent polymer material, and thus does not block light, but transmits incident light.

The organic pattern 260 includes concave slope surfaces, such as first and second slope surfaces IS1 and IS2, with a decreasing gradient from top to bottom on the basis of the third direction DR3. As shown in FIG. 7A, the side surfaces of the organic pattern 260 may be concave slope surfaces, such as first and second slope surfaces IS1 and IS2, with intermediate portions sloping towards the first conductive pattern CDP1. In an embodiment, the first organic pattern 261 may include the first slope surface IS1, and the second organic pattern 262 may include the second slope surface IS2. The first slope surface IS1 may have a concave shape with the intermediate portion sloping towards the first side surface SS1, and the second slope surface IS2 may have a concave shape with the intermediate portion sloping towards the second side surface SS2. As described below, in an embodiment the organic pattern 260 is provided by applying and curing an organic composition in an inkjet patterning process, and thus may have the concave slope surfaces, such as the first and second slope surfaces IS1 and IS2, sloping towards the first conductive pattern CDP1.

As described above, in an embodiment the first conductive pattern CDP1 may include the first lower conductive layer CL10, the second lower conductive layer CL20 disposed above the first lower conductive layer CL10 and directly contacting the first lower conductive layer CL10, and the third lower conductive layer CL30 disposed under the first lower conductive layer CL10 and directly contacting the first lower conductive layer CL10. However, embodiments of the present inventive concept are not necessarily limited thereto. For example, in an embodiment the third lower conductive layer CL30 may be omitted.

The organic pattern 260 may directly contact side surfaces of at least portions of the first lower conductive layer CL10, the second lower conductive layer CL20, and the third lower conductive layer CL30 included in the first conductive pattern CDP1. The organic pattern 260 may directly contact at least portions of the first encapsulation layer CL10. The organic pattern 260 may directly contact side surfaces of each of the first lower conductive layer CL10, the second lower conductive layer CL20, and the third lower conductive layer CL30.

In an embodiment, the second sensor insulation layer 230 may be disposed above the first conductive pattern CDP1 and the organic pattern 260, and cover the top surface of the first conductive pattern CDP1 and the first and second slope surfaces IS1 and IS2 of the organic pattern 260. The second sensor insulation layer 230 may directly contact the top surface of the first conductive pattern CDP1 and each of the first and second slope surfaces IS1 and IS2 of the organic pattern 260.

Referring to FIGS. 7A and 7B, a first taper angle θ1 of the first side surface SS1 of the first conductive pattern CDP1 may be different from a second taper angle θ2 of an intermediate point MP on the first slope surface IS1 of the first organic pattern 261. In an embodiment, the second taper angle θ2 of the intermediate point MP on the first slope surface IS1 may be less than the first taper angle θ1 of the first side surface SS1. In an embodiment, the first taper angle θ1 may be in a range of about 60 degrees to about 80 degrees. The second angle taper angle θ2 may be in a range of about 40 degrees to about 60 degrees. The intermediate point MP on the first slope surface IS1 may be defined as an intermediate point between the highest portion and the lowest portion of the first organic pattern 261 in the third direction DR3. Alternatively, the intermediate point MP on the first slope surface IS1 may correspond to an inflection point at which the gradient of the first slope surface IS1 shows the maximum change.

With reference to FIG. 7B, a description is given to an example gradient of each of the first side surface SS1 of the first conductive pattern CDP1 and the first slope surface IS1 of the first organic pattern 261 arranged adjacent to the first side surface SS1, and the same description may be given to the gradient of each of the second side surface SS2 of the first conductive pattern CDP1 and the second slope surface IS2 of the second organic pattern 262 arranged adjacent to the second side surface SS2.

In the first conductive pattern CDP1, the first lower conductive layer CL10 may have the first reflectance, the first conductivity, and the first thickness $T_1$. The second lower conductive layer CL20 may have the second reflectance lower than the first reflectance, the second conductivity lower than the first conductivity, and the second thickness $T_2$ less than the first thickness $T_1$. The third lower conductive layer CL30 may have a third thickness $T_3$ less than the first thickness $T_1$.

In an embodiment, the first thickness $T_1$ may be in a range of about 450 nm to about 1000 nm. Each of the second thickness $T_2$ and the third thickness $T_3$ may be in a range of about 10 nm to about 100 nm. The total thickness $T_t$ of the first conductive pattern CDP1 may be in a range of about 500 nm to about 1200 nm.

The input sensor 200 in an embodiment may include the organic pattern 260 disposed on the side surfaces (e.g., lateral ends) of at least portions of the plurality of conductive patterns, so that optical characteristics of the display device DD (see FIG. 5) including the input sensor 200 may be increased.

The input sensor 200 in an embodiment includes the organic pattern 260 disposed on the side surfaces of the first conductive pattern CDP1 that is a portion of the plurality of conductive patterns, and the organic pattern 260 includes the side surfaces having taper angles less than those of the first conductive patterns CDP1. Accordingly, the top surface of the second sensor insulation layer 230 disposed on (e.g., disposed directly thereon) the top of the first conductive pattern CDP1 and the organic pattern 260 may have a reduced step. As shown in FIG. 7A, the thickness T-a of a portion disposed on the top of the first conductive pattern CDP1 in the second sensor insulation layer 230 may be less than the thickness T-b of a portion disposed on the top of the first sensor insulation layer 210. As the step of the top surface of the second sensor insulation layer 230 is reduced, the step of another component disposed on the top of the second sensor insulation layer 230 may also be reduced. For example, in an embodiment, the upper steps of the light-blocking pattern BM (see FIG. 5) and the color filter CF (see FIG. 5) of the optical layer 300 (see FIG. 5) disposed above the second sensor insulation layer 230 may be reduced, and thus a function of the optical layer 300 for decreasing the reflectance of external light incident from the top of the display device DD may be increased.

Furthermore, the step of the top surface of the second sensor insulation layer 230 is reduced in the input sensor 200 in an embodiment by including the organic pattern 260 disposed on the side surfaces of the first conductive pattern CDP1 that is a portion of the plurality of conductive patterns, and thus the thickness of the second sensor insulation layer 230 may become thinner. As the thickness of the second sensor insulation layer 230 become thinner, a gap between the opening BM-OP (see FIG. 5) of the light-blocking pattern BM (see FIG. 5) and the opening PDL-OP (see FIG. 5) of the pixel definition layer PDL (see FIG. 5) may be reduced, thereby preventing reflection of the external light and reducing the emission of diffracted light, generated from the light-emitting element LD (see FIG. 5), to the outside to increase the optical characteristics of the display device DD including the input sensor 200.

Figure 8:
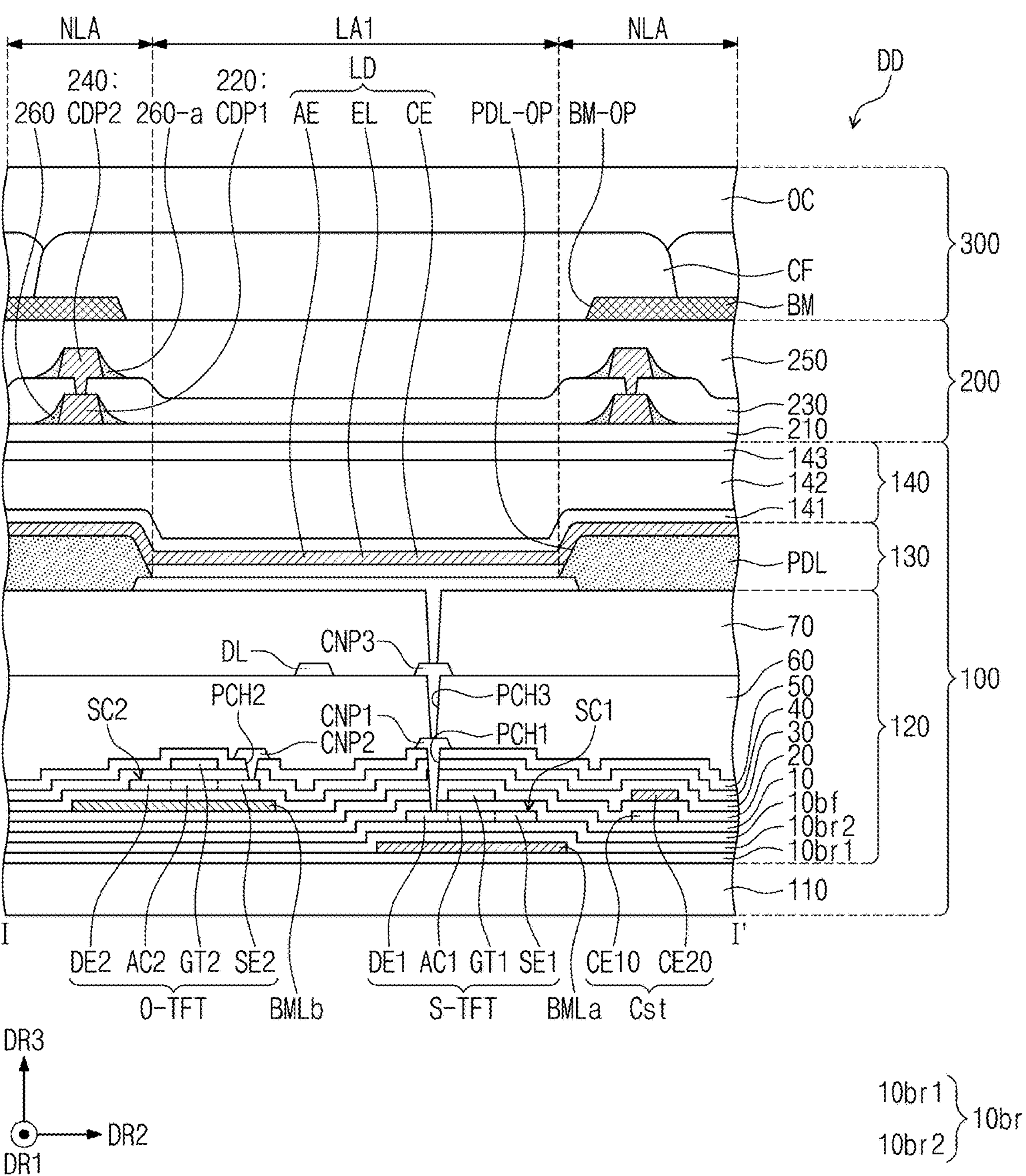
FIG. 8 is a cross-sectional view of a display device according to an embodiment of the present inventive concept.

FIG. 8 is a cross-sectional view of a display device according to an embodiment of the present inventive concept. Referring to FIG. 8, in relative to the input sensor 200 of the display device DD of FIG. 5, an input sensor 200-1 included in a display device DD-1 according to an embodiment may further include an additional organic pattern 260-*a* disposed on the side surfaces (e.g., lateral ends) of the second conductive pattern CDP2.

The additional organic pattern 260-*a* may be disposed on the side surfaces (e.g., lateral ends) of the second conductive pattern CDP2. The additional organic pattern 260-*a* may be disposed on the side surfaces (e.g., lateral ends) of the second conductive pattern CDP2 provided in plurality.

In an embodiment, the additional organic pattern 260-*a* may include the same material as the organic pattern 260. The additional organic pattern 260-*a* may include an organic binder. For example, the organic binder included in the additional organic pattern 260-*a* may include at least one among polyimide, polyamide, polybenzimidazole, polybenzothiazole, polybenzoxazole, polybenzobisxazole, or polyamide-imide. For example, the additional organic patterns 260-*a* may include polyimide and a material in which one among polybenzimidazole, polybenzothiazole, polybenzoxazole, polybenzobisxazole, or polyamide-imide is fluorinated. The additional organic pattern 260-*a* may include a mixture in which polyimide and the fluorinated polybenzoxazole are mixed.

The additional organic pattern 260-*a* includes concave slope surfaces, such as first and second slope surfaces IS1 and IS2, with a decreasing gradient from top to bottom on the basis of the third direction DR3. As shown in FIG. 8, the side surfaces of the additional organic pattern 260-*a* may be concave slope surfaces with intermediate portions sloping towards the second conductive pattern CDP2. In an embodiment, like the organic pattern 260, the additional organic pattern 260-*a* is provided by applying and curing an organic composition in an inkjet patterning process, and thus may have the concave slope surfaces sloping towards the second conductive pattern CDP2. The display device DD-1 according to an embodiment includes the additional organic pattern 260-*a* in the input sensor 200-1 to increase top surface planarization characteristics of the third sensor insulation layer 250 disposed on the second conductive pattern CDP2 and the additional organic pattern 260-*a*, and thus the upper steps of the light-blocking pattern BM and the color filter CF of the optical layer 300 disposed thereon may be reduced to further increase the function of the optical layer 300 for decreasing the reflectance of external light incident from the top of the display device DD-1.

Figure 9A:
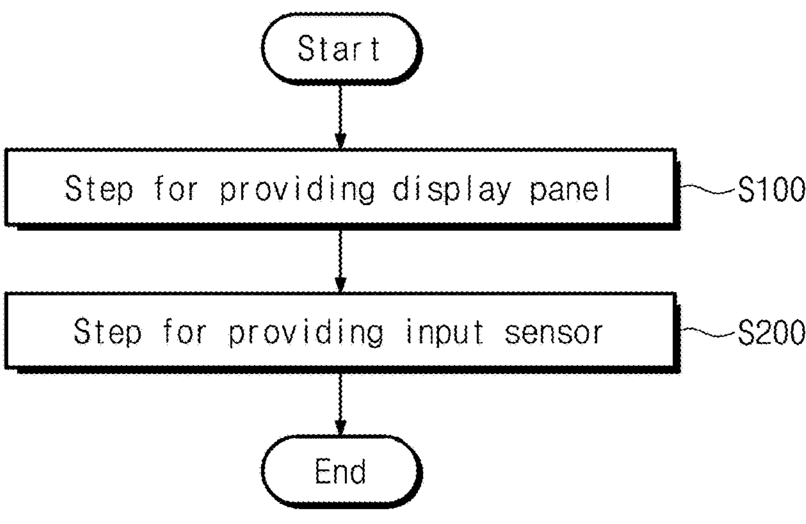
FIG. 9A is a flowchart of a display device manufacturing method according to an embodiment of the present inventive concept.
Figure 9B:
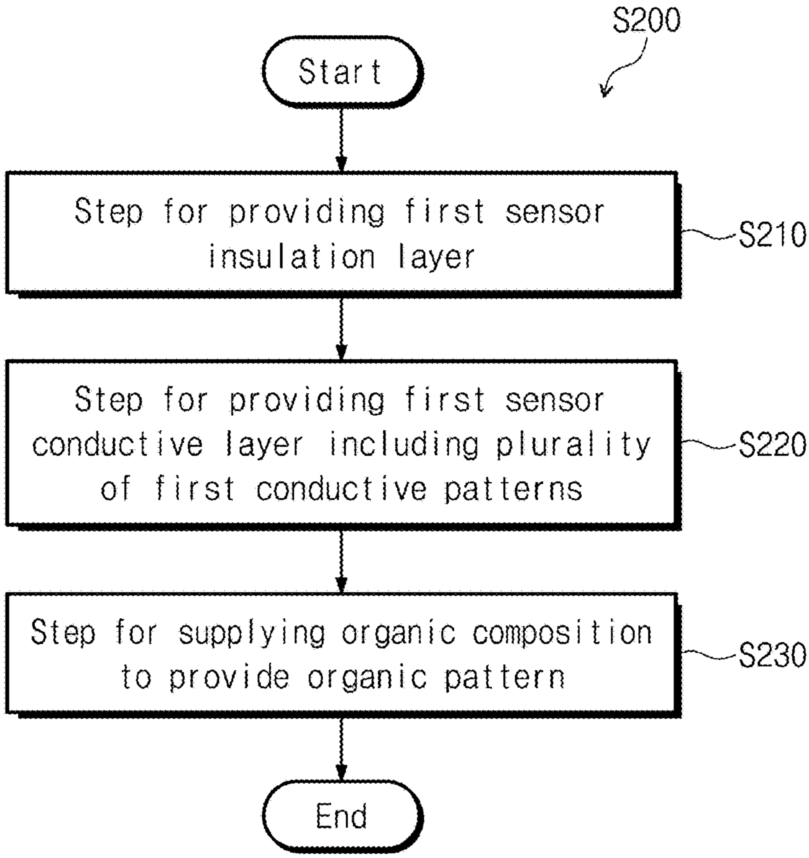
FIG. 9B is a flowchart of some steps of a display device manufacturing device according to an embodiment of the present inventive concept.
Figure 10A:
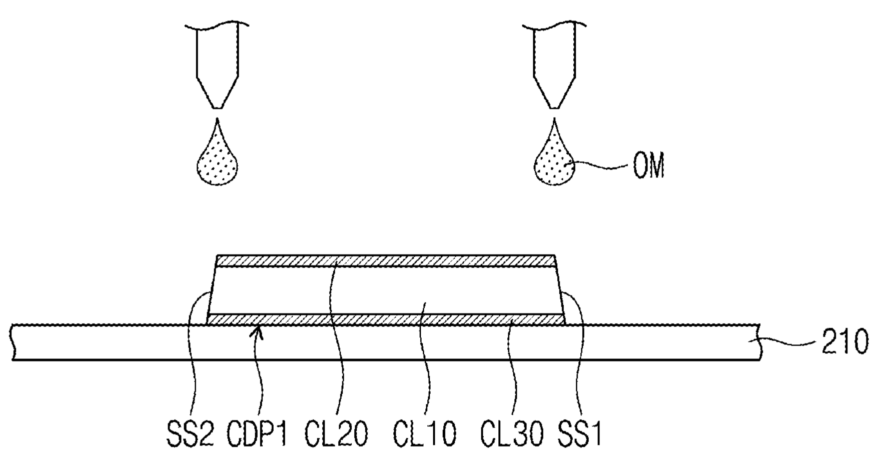
FIGS. 10A to 10C are cross-sectional views sequentially showing some steps of a display device manufacturing method according to embodiments of the present inventive concept.
Figure 10B:
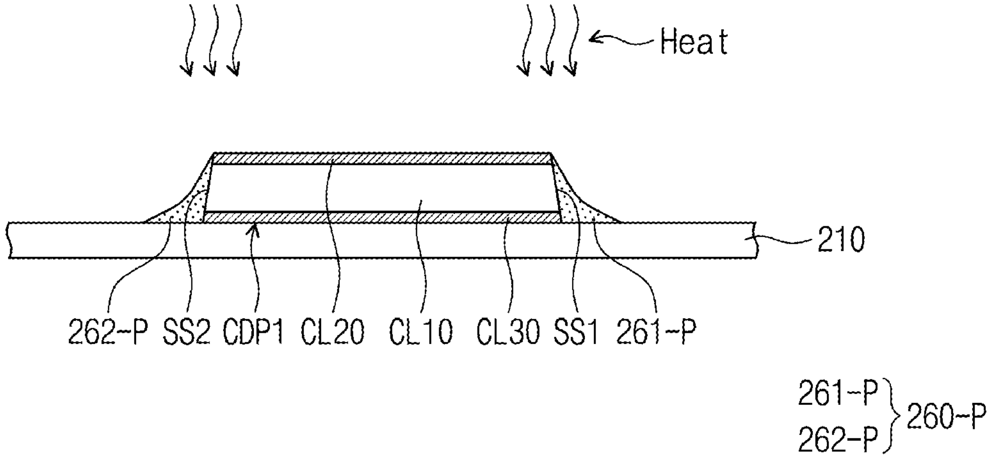
Figure 10C:
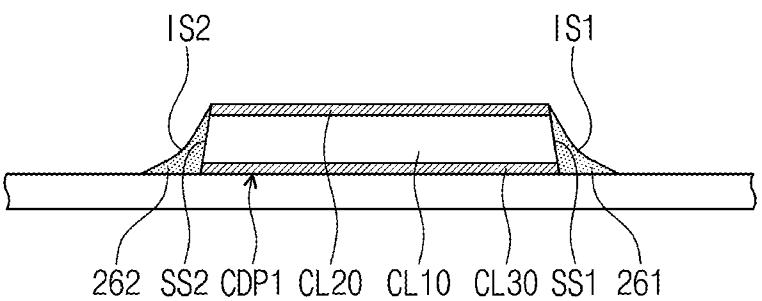

FIG. 9A is a flowchart of a display device manufacturing method according to an embodiment of the present inventive concept. FIG. 9B is a flowchart of some steps of a display device manufacturing device according to an embodiment of the present inventive concept. FIGS. 10A to 10C are cross-sectional views sequentially illustrating some steps of a display device manufacturing method according to embodiments of the present inventive concept. FIGS. 9B and 10A to 10C illustrate a flowchart of a step for providing an input sensor and cross-sections of some steps in the display device manufacturing device according to embodiments of the present inventive concept.

Referring to FIGS. 9A and 9B, the display manufacturing method according to an embodiment includes a step S100 for providing a display panel including a plurality of emission areas, and a step S200 for providing an input sensor disposed on the display panel. The step S200 for providing an input sensor includes: a step S210 for providing a first sensor insulation layer on the display panel; a step S220 for providing a first sensor conductive layer including a plurality of first conductive patterns on the first sensor insulation layer; and a step S230 for providing an organic composition so as to directly contact the side surfaces (e.g. lateral ends) of the plurality of first conductive patterns to provide an organic pattern.

Referring to FIGS. 5, 9B, and 10A, the step S200 for providing the input sensor 200 includes the step S210 for providing the first sensor insulation layer 210 on the display panel 100 (e.g., provided directly thereon in the third direction DR3), and the step S220 for providing the first sensor conductive layer 220 including the first conductive pattern CDP1 on the first sensor insulation layer 210 (e.g., provided directly thereon in the third direction DR3).

In an embodiment, the first conductive pattern CDP1 may include the first lower conductive layer CL10, the second lower conductive layer CL20 disposed above the first lower conductive layer CL10 and directly contacting the first lower conductive layer CL10, and the third lower conductive layer CL30 disposed under the first lower conductive layer CL10 and directly contacting the first lower conductive layer CL10. In an embodiment, the first conductive pattern CDP1 may be provided by depositing a conductive metal layer of a three-layer structure and then patterning the same.

Referring to FIGS. 5, 9B, 10A to 10C, the step S200 for providing the input sensor 200 includes a step S230 for providing the organic composition OM so as to directly contact the side surfaces SS1 and SS2 (e.g., lateral ends) of the first conductive pattern CDP1 to provide the organic pattern 260.

The organic composition OM may be provided on the side surfaces SS1 and SS2 of the first conductive pattern CDP1 in the inkjet process. In an embodiment, the organic composition OM may be provided on the side surfaces SS1 and SS2 of the first conductive pattern CDP1 in an ink pattern type through a nozzle to initially provide a preliminary organic pattern 260-P. In an embodiment, the preliminary organic pattern 260-P may be in a state in which the organic composition OM provided on the side surfaces SS1 and SS2 of the first conductive pattern CDP1 is uncured. The preliminary organic pattern 260-P may include a first preliminary organic pattern 261-P provided on the first side surface SS1 and a second preliminary organic pattern 262-P provided on the second side surface SS2.

In an embodiment, to provide the organic pattern 260 including the organic binder, the organic composition OM may include a precursor to be cured to provide the organic binder. In an embodiment, the organic composition OM may include, for example, a polyamic acid and fluorinated phenolic cross-linking compounds.

In an embodiment, the organic compound OM may include solid powder and a solvent having solid powder dispersed therein. The solid powder in the organic composition may be the above-described precursor. In an embodiment, within the organic composition OM, the solid content may be less than or equal to about 5 wt %. Within the organic composition OM, the solid content may be in a range of about 1 wt % to about 5 wt %, and the remaining may be a solvent. As the solid content of the organic composition OM is limited to the above described range, a discharge rate in the inkjet process is secured and a sufficient polymer material for providing the organic pattern 260 is supplied to provide the organic pattern 260 in the inkjet process.

In the step S230 for providing the organic pattern 260, the preliminary organic pattern 260-P is cured to provide the organic pattern 260. In an embodiment, in the step S230 for providing the organic pattern 260, the preliminary organic pattern 260-P may be thermally cured. However, embodiments of the present inventive concept are not necessarily limited thereto.

The organic pattern 260 is provided to have concave slope surfaces, such as the first and second slope surfaces IS1 and IS2 with a decreasing gradient from top to bottom. The organic pattern 260 is provided by applying and curing an organic composition in an inkjet patterning process, and thus may have the concave slope surfaces, such as the first and second slope surfaces IS1 and IS2 sloping towards the first conductive pattern CDP1.

Figures 11A, 11B:
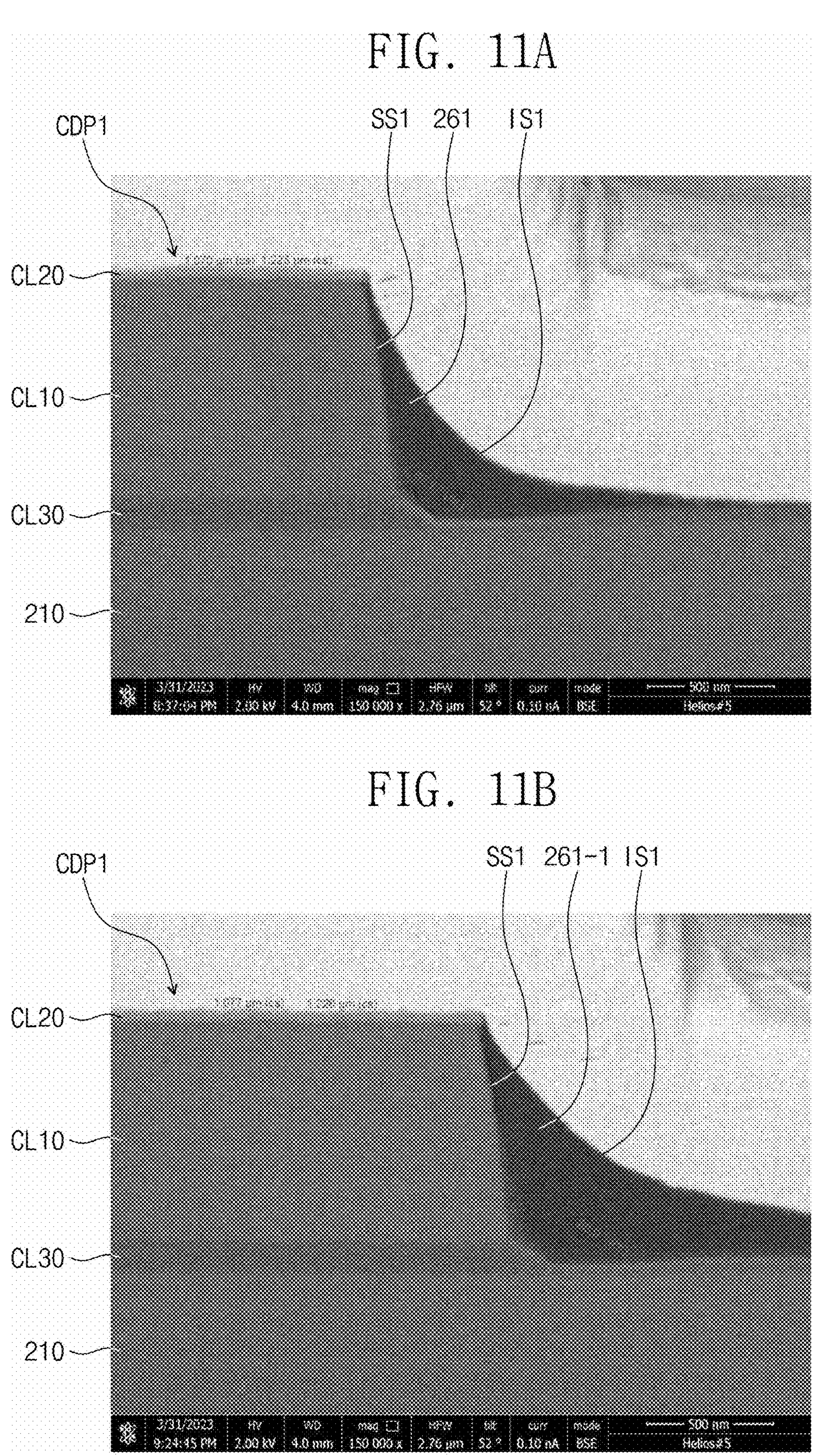
FIGS. 11A and 11B each are a captured image of an enlarged cross-section of some components in a portion of an input sensor according to embodiments of the present inventive concept.

FIGS. 11A and 11B each are a captured image of an enlarged cross-section of some components in a portion of an input sensor according to an embodiment of the present inventive concept. In an embodiment shown in FIG. 11A, the first organic pattern 261 is provided by supplying an organic composition having solid content of about 2 wt %, and in an embodiment shown in FIG. 11B, a first organic pattern 261-1 is provided by supplying an organic composition having solid content of about 4 wt %. The first organic patterns 261 and 261-1 of FIGS. 11A and 11B are provided to include a mixture in which polyimide is mixed with the fluorinated polybenzoxazole.

Referring to FIGS. 11A and 11B, it may be confirmed that the first organic patterns 261 and 261-1 having the concave slope surfaces IS1 with a decreasing gradient from top to bottom through the organic composition in which the solid content is adjusted in a range from about 1 wt % to about 5 wt %. In the step for providing an input sensor in the display panel manufacturing method according to an embodiment, the organic composition is supplied to provide the first organic patterns 261 and 261-1 with the concave slope surfaces IS1 sloping towards the first conductive pattern CDP1, and thus the planarization characteristics of upper components provided in the subsequent processes may be increased, thereby increasing the optical characteristics of the display device manufactured through the display device manufacturing method according to the embodiment.

According to embodiments of the present inventive concept, the planarization characteristics of the input sensor and a component disposed on the input sensor included in the display device may be enhanced to increase the optical characteristics of the display device.

While the present inventive concept has been described with reference to non-limiting embodiments thereof, it will be clear to those of ordinary skill in the art to which the present inventive concept pertains that various changes and modifications may be made to the described embodiments without departing from the spirit and technical area of the present inventive concept. Thus, the scope of the present inventive concept shall not be restricted or limited by the foregoing description.

What is claimed is:

1. A display device comprising:

a display panel comprising a plurality of emission areas; and an input sensor on the display panel, wherein the input sensor comprises:

a first sensor insulation layer on the display panel;

a first sensor conductive layer disposed on the first sensor insulation layer, the first sensor conductive layer comprising a plurality of first conductive patterns;

an organic pattern directly contacting side surfaces of each of the plurality of first conductive patterns, the organic pattern comprising an organic binder; and a second sensor insulation layer on the first sensor conductive layer, wherein the organic pattern comprises concave slope surfaces having a decreasing gradient from a top of the organic pattern to a bottom of the organic pattern in a thickness direction of the display device, and wherein a total thickness in the thick d ion of the display device of a first portion of the second sensor insulation layer contacting the first sensor conductive layer is less than a total thickness in the thickness direction of the display device of a second portion of the second sensor insulation layer contacting the first sensor insulation laver.

2. The display device of claim 1, wherein the organic binder comprises at least one compound selected from polyimide, polyamide, polybenzimidazole, polybenzothiazole, polybenzoxazole, polybenzobisxazole, and polyamide-imide.

3. The display device of claim 1, wherein the organic pattern is optically transparent in a visible ray wavelength region.

4. The display device of claim 1, further comprising:

an optical layer disposed on the input sensor, the optical layer comprising a color filter overlapping each of the plurality of emission areas in a plan view.

5. The display device of claim 4, wherein the optical layer further comprises a light-blocking pattern overlapping each of the plurality of first conductive patterns in the plan view.

6. The display device of claim 1, wherein a taper angle of the side surfaces of each of the plurality of first conductive patterns is in a range of about 60 degrees to about 80 degrees.

7. The display device of claim 1, wherein a taper angle at intermediate points on the concave slope surfaces of the organic pattern is in a range of about 40 degrees to about 60 degrees.

8. The display device of claim 1, wherein:

each of the plurality of first conductive patterns comprises a first side surface and a second side surface facing the first side surface; and the organic pattern comprises a first organic pattern directly contacting the first side surface, and a second organic pattern directly contacting the second side surface.

9. The display device of claim 1, wherein each of the plurality of first conductive patterns comprises:

a first lower conductive layer on the first sensor insulation layer; and a second lower conductive layer disposed on the first lower conductive layer, the second lower conductive layer comprising a material that is different from a material of the first lower conductive layer.

10. The display device of claim 1, wherein the input sensor further comprises:

a second sensor conductive layer disposed on the second sensor insulation layer, the second sensor conductive layer comprising a plurality of second conductive patterns.

11. The display device of claim 10, wherein the input sensor further comprises an additional organic pattern directly contacting side surfaces of each of the plurality of second conductive patterns, the additional organic pattern comprising the organic binder.

12. The display device of claim 1, wherein a thickness of each of the plurality of first conductive patterns is in a range of about 500 nm to about 1200 nm.

13. The display device of claim 1, wherein the display panel comprises:

a pixel definition layer having emission openings defined therein that respectively overlap the plurality of emission areas in a plan view; and light-emitting elements comprising a light-emitting layer disposed at least within the emission openings.

14. The display device of claim 13, wherein the display panel further comprises an encapsulation layer on the light-emitting elements and the pixel definition layer, wherein the input sensor is disposed directly on the encapsulation layer.

15. The display device of claim 1, wherein the input sensor further comprises:

a first detection electrode comprising a plurality of first detection patterns arranged along a first direction and a plurality of bridge patterns connecting adjacent two first detection patterns of the plurality of first detection patterns to each other; and a second detection electrode spaced apart from the first detection electrode, the second detection electrode comprising a plurality of second detection patterns extending along a second direction crossing the first direction, wherein portions of the plurality of first detection patterns, the plurality of second detection patterns, and the plurality of bridge patterns comprise the plurality of first conductive patterns.

16. An electronic device comprising:

a display device comprising:

a display panel comprising a plurality of emission areas; and an input sensor on the display panel, wherein the input sensor comprises:

a first sensor insulation layer on the display panel;

a first sensor conductive layer disposed on the first sensor insulation layer, the first sensor conductive layer comprising a plurality of first conductive patterns; and an organic pattern directly contacting side surfaces of each of the plurality of first conductive patterns, the organic pattern comprising an organic binder, and a second sensor insulation layer on the first sensor conductive layer, wherein the organic binder comprises at least one compound selected from polyimide, polyamide, polybenzimidazole, polybenzothiazole, polybenzoxazole, polybenzobisxazole, and polyamide-imide, and wherein a total thickness in a thickness direction of the display device of a first portion of the second sensor insulation layer contacting the first sensor conductive layer is less than a total thickness in the thickness direction of the display device of a second portion of the second sensor insulation layer contacting the first sensor insulation laver.

17. The electronic device of claim 16, wherein:

the organic binder comprises the polyimide; and the organic binder co material selected from polybenzimidazole, polybenzothiazole, polybenzoxazole, polybenzobisxazole, and polyamide-imide.

18. A display device manufacturing method comprising:

providing a display panel comprising a plurality of emission areas; and providing an input sensor on the display panel, wherein the providing of the display panel comprises:

providing a first sensor insulation layer on the display panel;

providing a first sensor conductive layer on the first sensor insulation layer, the first sensor conductive layer comprising a plurality of first conductive patterns;

supplying an organic composition to directly contact side surfaces of each of the plurality of first conductive patterns to provide an organic pattern; and providing a second sensor insulation layer on the first sensor conductive layer, wherein the organic pattern comprises concave slope surfaces having a decreasing gradient from a top of the organic pattern to a bottom of the organic pattern in a thickness direction of the display panel, and wherein a total thickness in the thickness direction of the display device of a first portion of the second sensor insulation layer contacting the first sensor conductive layer is less than a total thickness in the thickness direction of the display device of a second portion of the second sensor insulation layer contacting the first sensor insulation layer.

19. The display device manufacturing method of claim 18, wherein:

the organic composition comprises solid powder and a solvent having the solid powder dispersed therein, wherein a solid content in the organic composition is less than or equal to about 5 wt %.

20. The display device manufacturing method of claim 18, wherein:

the organic composition initially forms a preliminary organic pattern on the side surfaces of each of the plurality of first conductive patterns;

the preliminary organic pattern is cured to provide the organic pattern; and the organic pattern comprises at least one compound selected from polyimide, polyamide, polybenzimidazole, polybenzothiazole, polybenzoxazole, polybenzobisxazole, and polyamide-imide.

* * * * *